United States Patent
Hamada

(10) Patent No.: US 9,525,833 B2
(45) Date of Patent: *Dec. 20, 2016

(54) IMAGING DEVICE FOR PHASE DIFFERENCE DETECTION

(71) Applicant: SAMSUNG ELECTRONICS CO., LTD., Suwon-si, Gyeonggi-do (KR)

(72) Inventor: Masataka Hamada, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 196 days.

This patent is subject to a terminal disclaimer.

(21) Appl. No.: 14/024,975

(22) Filed: Sep. 12, 2013

(65) Prior Publication Data
US 2014/0008514 A1 Jan. 9, 2014

Related U.S. Application Data

(63) Continuation of application No. 13/343,939, filed on Jan. 5, 2012, now Pat. No. 9,219,871.

(30) Foreign Application Priority Data

Jul. 20, 2011 (KR) .......................... 10-2011-0072078

(51) Int. Cl.
H04N 5/232 (2006.01)
H04N 5/335 (2011.01)
(Continued)

(52) U.S. Cl.
CPC ........ *H04N 5/3696* (2013.01); *H04N 5/23212* (2013.01); *H04N 5/335* (2013.01);
(Continued)

(58) Field of Classification Search
None
See application file for complete search history.

(56) References Cited

U.S. PATENT DOCUMENTS 6,829,008 B1 12/2004 Kondo et al.
8,823,838 B2 9/2014 Goto
(Continued)

FOREIGN PATENT DOCUMENTS

CN 101662588 A 3/2010
CN 102298246 A 12/2011
(Continued)

OTHER PUBLICATIONS

Office Action issued in related application CN 201210254058.X, with English language translation, Mar. 1, 2016, 34 pages.

*Primary Examiner* — Justin P Misleh
(74) *Attorney, Agent, or Firm* — Drinker Biddle & Reath LLP

(57) ABSTRACT

An imaging device includes phase difference detection pixels. The imaging device receives an image formed by an optical system and includes a plurality of pixels that are two-dimensionally arranged. Each of the plurality of pixels include a micro lens; a photoelectric conversion unit positioned below the micro lens; and an optical aperture disposed between the micro lens and the photoelectric conversion unit and that is eccentric with respect to an optical axis of the micro lens, wherein the plurality of pixels of the imaging device output a signal for obtaining phase difference. The imaging device performs phase difference detection on the entire surface of a captured image without addition of pixels.

2 Claims, 28 Drawing Sheets

(51) Int. Cl.
    *H04N 5/369*     (2011.01)
    *H04N 9/04*     (2006.01)
    *G03B 13/36*     (2006.01)
    *G02B 7/34*     (2006.01)

(52) U.S. Cl.
    CPC ............ *H04N 9/045* (2013.01); *G02B 7/346* (2013.01); *G03B 13/36* (2013.01)

(56) References Cited

U.S. PATENT DOCUMENTS

| | | | | |
|---|---|---|---|---|
| 2007/0154200 A1* | 7/2007 | Utagawa | ................ | H04N 9/045 396/111 |
| 2008/0143858 A1* | 6/2008 | Kusaka | ................ | H04N 5/3696 348/294 |
| 2009/0278966 A1* | 11/2009 | Kusaka | .................... | G02B 7/36 348/294 |
| 2010/0045849 A1 | 2/2010 | Yamasaki | | |
| 2011/0085785 A1* | 4/2011 | Ishii | ....................... | G03B 13/00 396/104 |
| 2011/0109776 A1* | 5/2011 | Kawai | ........................... | 348/273 |
| 2011/0249156 A1* | 10/2011 | Goto | ............................ | 348/272 |
| 2011/0310280 A1* | 12/2011 | Goto | ............................ | 348/302 |
| 2011/0317042 A1* | 12/2011 | Goto | ............................ | 348/241 |

FOREIGN PATENT DOCUMENTS

| | | | |
|---|---|---|---|
| JP | 2001-177756 A | | 6/2001 |
| JP | 3592147 B2 | | 11/2004 |
| JP | 2006-154065 A | | 6/2006 |
| JP | 2007065330 A | * | 3/2007 |
| JP | 2007-155929 A | | 6/2007 |
| JP | 3977062 B2 | | 9/2007 |
| JP | 2007-317951 A | | 12/2007 |

* cited by examiner

| RLa | GLa | RRa | GRa |
|-----|-----|-----|-----|
| GLa | BLa | GRa | BRa |
| RLa | GLa | RRa | GRa |
| GLa | BLa | GRa | BRa |

51  52  53  54

FIG. 22A
| RLb | GLb | RLb | GLb |
|---|---|---|---|
| GLb | BLb | GLb | BLb |
| RRb | GRb | RRb | GRb |
| GRb | BRb | GRb | BRb |
FIG. 22B
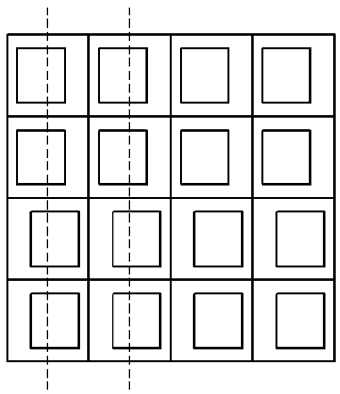
FIG. 23A
| RLb | GLb | RLb | GLb |
|---|---|---|---|
| GLb | BLb | GLb | BLb |
| RRb | GRb | RRb | GRb |
| GRb | BRb | GRb | BRb |
FIG. 23B
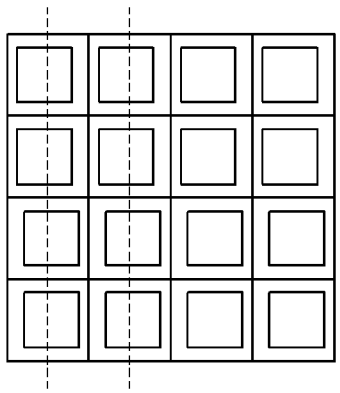

FIG. 25A
| RLb | GLb | RLb | GLb |
|-----|-----|-----|-----|
| GLa | BLa | GLa | BLa |
| RRb | GRb | RRb | GRb |
| GRa | BRa | GRa | BRa |
. . . .
. . . .
FIG. 25B
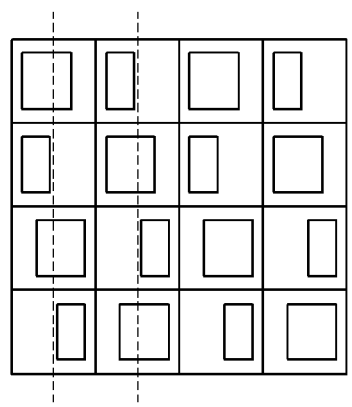
FIG. 26A
| RLb | GLa | RRb | GRa |
|-----|-----|-----|-----|
| GLa | BLb | GRa | BLb |
| RLb | GLa | RRb | GRa |
| GLa | BLb | GRa | BRb |
FIG. 26B
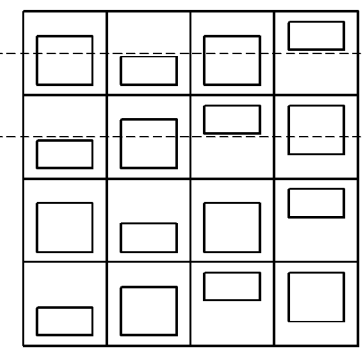

| RUa | GUa | RDa | GDa |
|---|---|---|---|
| GUa | BDa | GDa | BUa |
| RDa | GDa | RUa | GUa |
| GDa | BRa | GUa | BDa |

| RUb | GUb | RDb | GDb |
| --- | --- | --- | --- |
| GUb | BDb | GDb | BUb |
| RDb | GDb | RUb | GUb |
| GDb | BUb | GUb | BDb |

IMAGING DEVICE FOR PHASE DIFFERENCE DETECTION

CROSS-REFERENCE TO RELATED PATENT APPLICATIONS

This application is a continuation application of U.S. patent application Ser. No. 13/343,939, filed Jan. 5, 2012, which claims the priority benefit of Korean Patent Application No. 10-2011-0072078, filed on Jul. 20, 2011, in the Korean Intellectual Property Office, the disclosure of which is incorporated herein in its entirety by reference.

BACKGROUND

1. Field

Embodiments relate to an imaging device including phase difference detection pixels.

2. Description of the Related Art

Devices including phase difference detection pixels that perform phase difference detection autofocus (AF) by using an imaging device for image input have been proposed. Generally, phase difference detection pixels are added between imaging pixels, and phase difference is detected using the added pixels. However, only phase difference detection is performed in an area in which phase difference detection pixels are present, and the phase difference detection is not performed in any other area. In addition, there is a big difference between outputs of phase difference detection pixels and that of other pixels, and the phase difference detection pixels are regarded as defect pixels. As a result, the quality of captured images is deteriorated.

SUMMARY

Embodiments include an imaging device in which phase difference detection may be performed using entire pixels without addition of pixels and focal point information (position and direction of a focal point) may be obtained therefrom.

According to an embodiment, an imaging device configured to receive an image formed by an optical system includes a plurality of pixels that are two-dimensionally arranged. Each of the plurality of pixels includes: a micro lens; a photoelectric conversion unit positioned below the micro lens; and an optical aperture disposed between the micro lens and the photoelectric conversion unit and that is eccentric with respect to an optical axis of the micro lens, wherein the plurality of pixels of the imaging device output a signal for obtaining phase difference.

The optical aperture may include a light shielding mask.

The optical aperture may be formed by eccentrically positioning a wire layer of each of the plurality of pixels.

Each of the plurality of pixels may have an optical aperture that includes an optical axis of the micro lens.

Each of the plurality of pixels may have an optical aperture that includes an optical axis of the micro lens, or an optical aperture that either does not contact the optical axis of the micro lens or contacts but does not include the optical axis.

Each of the plurality of pixels may have an optical aperture that either does not contact an optical axis of the micro lens or contacts but does not include the optical axis.

Each of the plurality of pixels may include a red (R), green (G), or blue (B) color filter.

The G color filter may be disposed in a pixel having a first aperture ratio, and the R or B color filter may be disposed in a pixel having a second aperture ratio.

Each of the plurality of pixels may include a cyan (C), magenta (M), or yellow (Y) color filter.

The color filter may be disposed in a pixel having a first aperture ratio, and the color filter may not be disposed in a pixel having a second aperture ratio that is greater than the first aperture ratio.

The optical aperture may be eccentrically formed in horizontal and vertical directions.

The optical aperture may be eccentrically formed in an inclined direction and in a direction converse to the inclined direction.

The optical aperture may include a plurality of eccentric optical apertures so as for a full-aperture to use different lenses.

A focal point detection area having a first aperture ratio may be arranged at a plurality of positions including a center of the imaging device, and a focal direction detection area may be arranged at a position other than the focal point detection area.

BRIEF DESCRIPTION OF THE DRAWINGS

The above and other features and advantages will become more apparent by describing in detail exemplary embodiments with reference to the attached drawings in which:

FIGS. 22A and 22B illustrate the phase difference pixels illustrated in FIGS. 19A and 19B configured in a horizontal direction, according to another embodiment;

FIGS. 23A and 23B illustrate the phase difference pixels illustrated in FIGS. 19A and 19B configured in a horizontal direction, according to another embodiment;

FIGS. 25A and 25B illustrate the phase difference pixels illustrated in FIGS. 19A and 19B configured in a horizontal direction, according to another embodiment;

FIGS. 26A and 26B illustrate the phase difference pixels of FIGS. 25A and 25B configured in a vertical direction, according to an embodiment;

DETAILED DESCRIPTION

Figure 1:
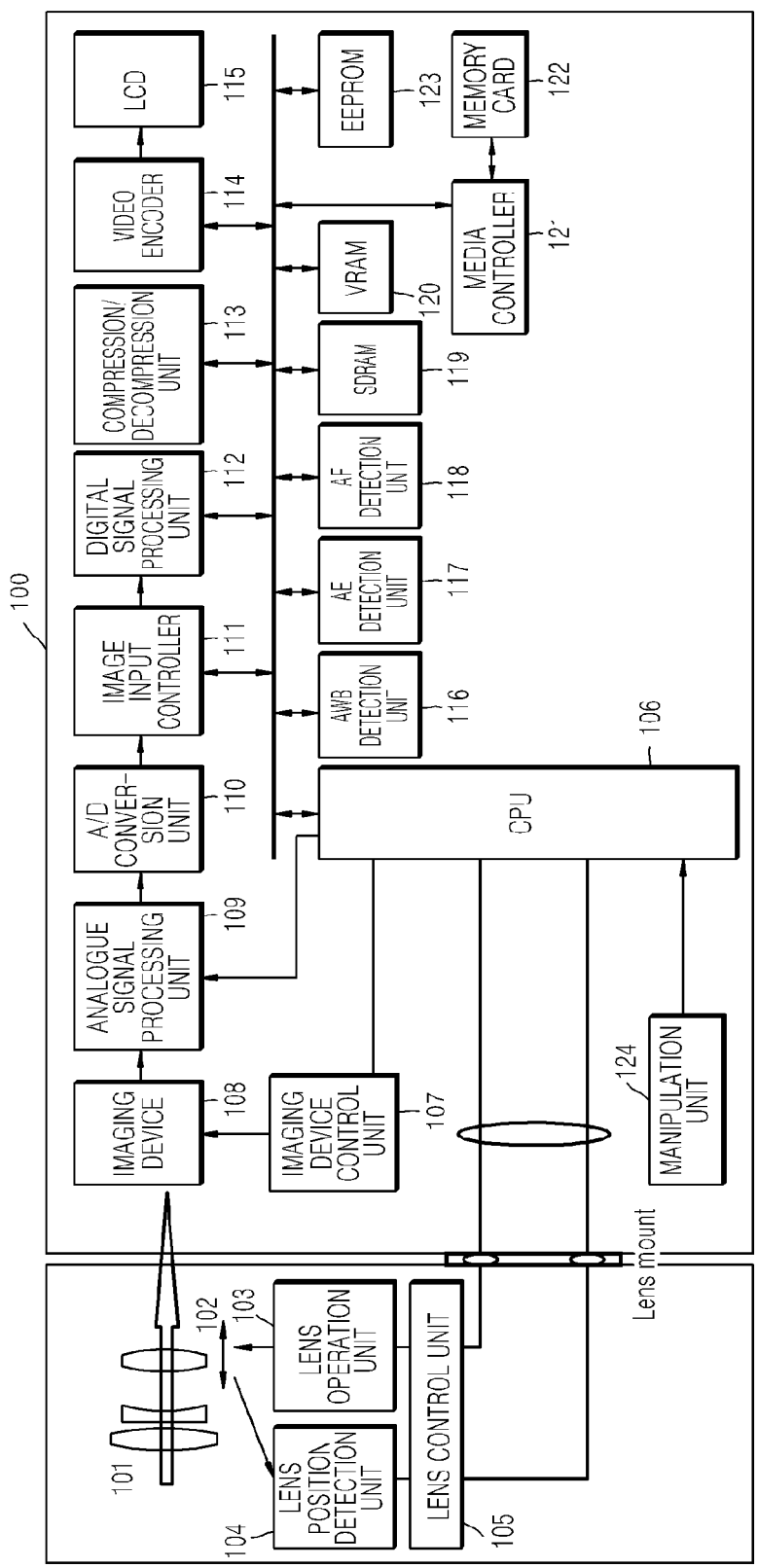
FIG. 1 is a block diagram illustrating a structure of a digital image processing device including an imaging device, according to an embodiment.

Particular embodiments will be illustrated in the drawings and described in detail in the written description; however, this should not be construed as limiting, and it is to be appreciated that all changes, equivalents, and substitutes that do not depart from the spirit and technical scope are encompassed within the invention as recited in the following claims. In the description, certain detailed explanations of related art are omitted when it is deemed that they may unnecessarily obscure the essence of the invention as recited in the following claims.

Embodiments will now be described more fully with reference to the accompanying drawings, in which exemplary embodiments are shown. In the drawings, like reference numerals denote like elements, and thus a detailed description thereof is provided once.

FIG. 1 is a block diagram illustrating a structure of a digital image processing device 100 including an imaging device 108, according to an embodiment.

Referring to FIG. 1, the digital image processing device 100 and a lens are configured separate from each other, but the imaging device 108 is configured in an integrated manner with the digital image processing device 100. In addition, the digital image processing device 100 including the imaging device 108 may perform phase difference autofocus (AF) and contrast AF.

The digital image processing device 100 includes an imaging lens 101 including a focus lens 102. The digital image processing device 100 has focus detection capability, and thus the focus lens 102 may be operated. The imaging lens 101 includes a lens operation unit 103 that operates the focus lens 102, a lens position detection unit 104 that detects a position of the focus lens 102, and a lens control unit 105 that controls the focus lens 102. The lens control unit 105 transmits information on focus detection to a CPU 106 of the digital image processing device 100.

The digital image processing device 100 includes the imaging device 108, and thus captures light that is incident on and transmitted through the imaging lens 101, thereby generating an image signal. The imaging device 108 may include a plurality of photoelectric conversion units (not shown) arranged in a matrix form and a transfer path (not shown) that transfers charges from the photoelectric conversion units, thereby reading an image signal.

An imaging device control unit 107 generates a timing signal, thereby controlling the imaging device 108 to capture an image. In addition, the imaging device control unit 107 sequentially reads out image signals when accumulation of charges on each of a plurality of scan lines is terminated.

The read-out image signals are converted to digital image signals by an ND conversion unit 110 via an analogue signal processing unit 109, and then input to an image input controller 111 and processed therein.

The digital image signals input to the image input controller 111 are subjected to auto white balance (AWB), auto exposure (AE) and AF calculations respectively performed by an AWB detection unit 116, an AE detection unit 117, and an AF detection unit 118. The AF detection unit 118 outputs a detection value with respect to a contrast value during contrast AF, and outputs pixel information to the CPU 106 during phase difference AF, thereby allowing phase difference calculation to be performed in the CPU 106. The phase difference calculation performed by the CPU 106 may be obtained by calculating a correlation between a plurality of pixel row signals. As a result of the phase difference calculation, a position or direction of a focal point may be obtained.

The image signals are also stored in a synchronous dynamic random access memory 119 (SDRAM), that is, a temporary memory. A digital signal processing unit 112 performs a series of image signal processing operations such as gamma correction to create a displayable live view image or captured image. A compression/decompression unit 113 compresses an image signal in a JPEG compression format or an H.264 compression format or decompresses the image signal when image signal processing is performed. An image file including the image signal compressed in the compression/decompression unit 113 is transmitted to a memory card 122 via a media controller 121 to be stored therein.

In FIG. 1, the CPU 106, the analogue signal processing unit 109, the ND conversion unit 110, the image input controller 111, the digital signal processing unit 112, the compression/decompression unit 113, a video controller 114, the AWB detection unit 116, the AE detection unit 117, the AF detection unit 118, and the media controller 121 may be referred to as an image processing circuit. The image processing circuit may be commonly referred to as an integrated circuit (IC) and the CPU 106 may be the image processing circuit.

Image information for display is stored in a video RAM 120 (VRAM), and an image is displayed on an LCD 115 via the video encoder 114. The CPU 106 controls overall operations of each unit of the digital image processing device 100. An electrically erasable programmable read-only memory (EEPROM) 123 stores and maintains information for correcting defects of pixels of the imaging device 108 or adjustment information on the pixel defects. A manipulation unit 124 is a unit through which various commands of a user are input to manipulate the digital image processing device 100. The manipulation unit 124 may include various buttons such as a shutter-release button, a main button, a mode dial, a menu button, or the like.

Figure 2:
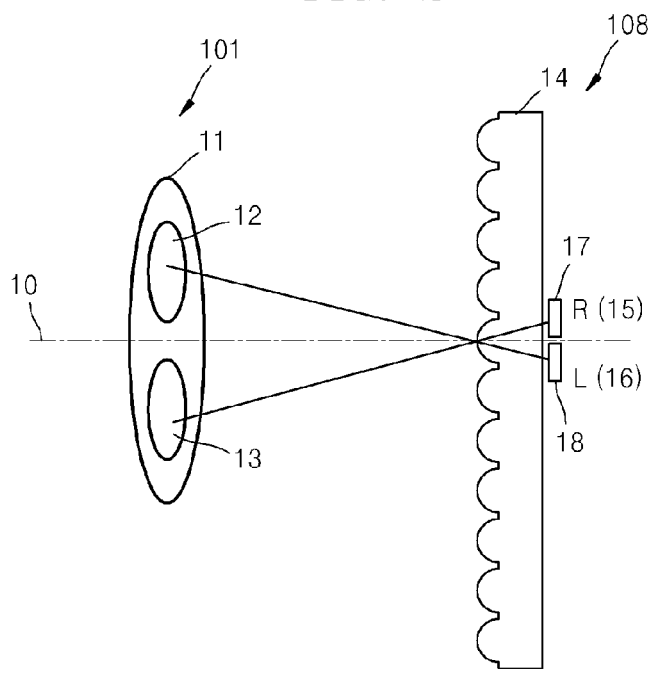
FIG. 2 is a diagram for explaining a principle of phase difference pixels by using the imaging device of FIG. 1, according to an embodiment.

FIG. 2 is a diagram for explaining a principle of phase difference pixels by using the imaging device 108 of FIG. 1, according to an embodiment.

Light of a subject that has transmitted through an imaging lens 11 transmits through a micro lens array 14 to be incident onto light receiving pixels R(15) and L(16). Masks 17 and 18 for restricting pupils 12 and 13 of the imaging lens 11, or restricted optical apertures, are respectively formed in portions of the light receiving pixels R(15) and L(16). Among the pupils 12 and 13 of the imaging lens 11, light from the pupil 12 above an optical axis 10 of the imaging lens 11 is incident onto the light receiving pixel L(16), and light from the pupil 13 below the optical axis 10 of the imaging lens 11 is incident onto the light receiving pixel R(15). Light that is reverse transmitted to the pupils 12 and 13 by the micro lens array 14 is received by the light receiving pixels R(15) and L(16) by the masks 17 and 18 or the optical apertures, which is referred to as pupil division.

Figure 3A:
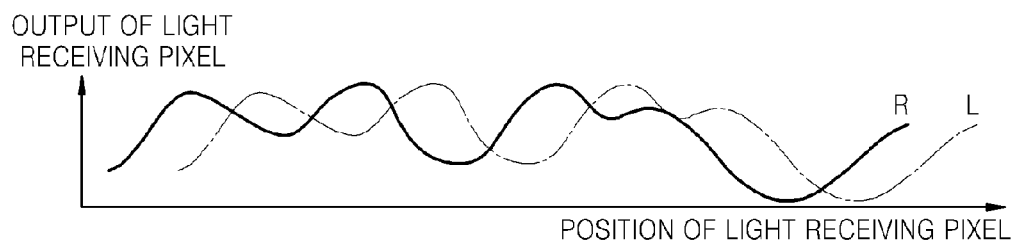
FIGS. 3A and 3B are graphs for explaining phase difference of light receiving pixels according to FIG. 2, according to an embodiment.
Figure 3B:
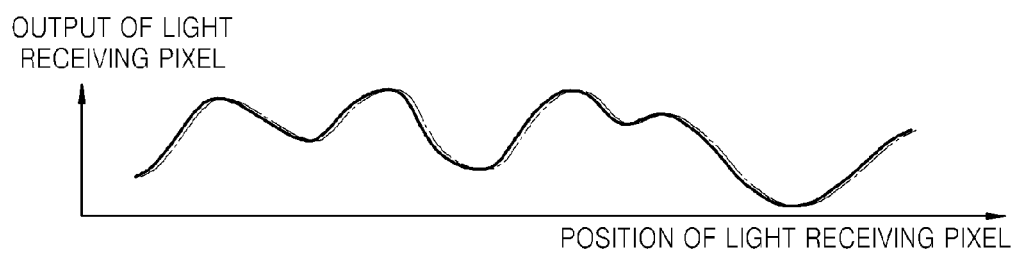

FIGS. 3A and 3B are graphs for explaining phase difference of light receiving pixels according to FIG. 2, according to an embodiment. Continuous output of the light receiving pixels R(15) and L(16) by pupil division by the micro lens array 14 is illustrated in FIGS. 3A and 3B. In FIGS. 3A and 3B, a horizontal axis denotes positions of the light receiving pixels R(15) and L(16), and a vertical axis denotes output values of the light receiving pixels R(15) and L(16). Referring to FIGS. 3A and 3B, graphs showing output of the light receiving pixels R(15) and L(16) exhibit the same shape, but exhibit different phases with respect to position. This is due to image formation positions of light from the eccentrically formed pupils 12 and 13 of the imaging lens 11 being different from each other. Thus, when focus points of light from the eccentrically formed pupils 12 and 13 are inconsistent with each other, the light receiving pixels R(15) and L(16) exhibit an output phase difference, as illustrated in FIG. 3A. On the other hand, when focus points of light from the eccentric pupils 12 and 13 are consistent with each other, images are formed at the same position as illustrated in FIG. 3B. In addition, a direction of focus may be determined from the focus difference. A front-focusing indicates that an object is in a front focus state, and the front-focusing is illustrated in FIG. 3A. Referring to FIG. 3A, the phase of the output of the light receiving pixel R(15) is shifted further to the left than that in the focused phase, and the phase of the output of the light receiving pixel L(16) is shifted further to the right than that in the focused phase. In contrast, a back-focusing indicates that an object is in a back focus state. In this case, the phase of the output of the light receiving pixel R(15) is shifted further to the right than that in the focused phase, and the phase of the output of the light receiving pixel L(16) is shifted further to the left than that in the focused phase. The shift amount between the phases of the light receiving pixels R(15) and L(16) may be converted to a deviation amount between the focuses.

Figure 4:
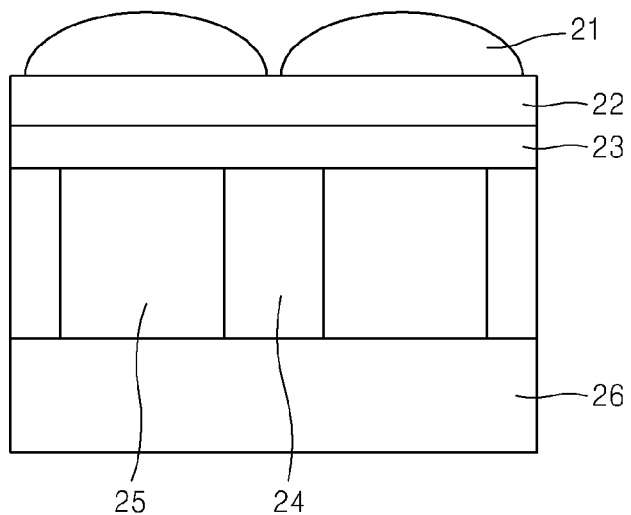
FIG. 4 is a diagram illustrating a structure of pixels constituting a general imaging device.

FIG. 4 is a diagram illustrating a structure of pixels constituting a general imaging device.

Referring to FIG. 4, two pixels are illustrated. The two pixels include micro lenses 21, a surface layer 22, a color filter layer 23, a wire layer 24, photodiode layers 25, and a substrate layer 26. A photoelectric conversion unit of each pixel may include at least portions of the wire layer 24 and the photodiode layer 25.

Light from a subject enters the photodiode layer 25 of each pixel via the micro lenses 21, and a photodiode in the photodiode layer 25 of each pixel generates charges that serve as pixel information. The generated charges are released through the wire layer 24. Such incident light from a subject is all light that has transmitted through an exit pupil of an imaging lens, and luminance information corresponding to a subject position may be obtained corresponding to a pixel position. In general, the color filter layer 23 may be a layer including pixels of red (R), green (G), and blue (B). Also, the color filter layer 23 may include pixels of cyan (C), magenta (M), and yellow (Y).

Figure 5:
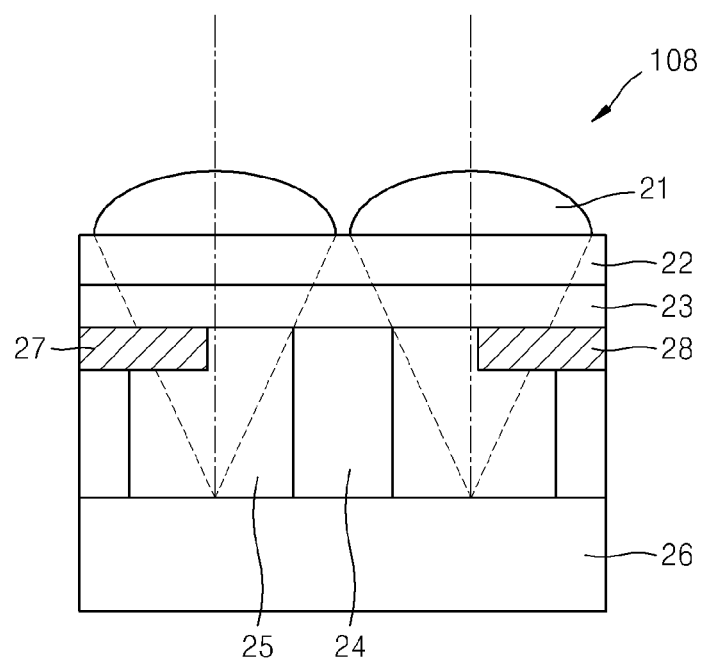
FIG. 5 is a diagram illustrating a structure of pixels constituting a phase difference imaging device of FIG. 1, according to an embodiment.

FIG. 5 is a diagram illustrating a structure of pixels constituting the phase difference imaging device 108 of FIG. 1, according to an embodiment. An exemplary embodiment of phase difference pixels obtained by forming masks 27 and 28 in optical apertures of the imaging device illustrated in FIG. 4 so as to obtain R and L signals as illustrated in FIGS. 3A and 3B is illustrated in FIG. 5.

Referring to FIG. 5, a mask 27 for R pixels and a mask 28 for L pixels are each interposed between the micro lenses 21 and the photodiode layers 25, but the positions of the masks 27 and 28 are not limited to the example illustrated in FIG. 5. For example, the masks 27 and 28 may be interposed somewhere else therebetween. In FIG. 5, optical axes of the micro lenses 21 are each represented by a dashed dotted line, and paths through which light is incident from the micro lenses 21 are each represented by a broken line. The amounts of light incident on the photodiode layers 25 are restricted by 50% by the masks 27 and 28, respectively, when the masks 27 and 28 correspond to the optical axes of the micro lenses 21.

Figure 6:
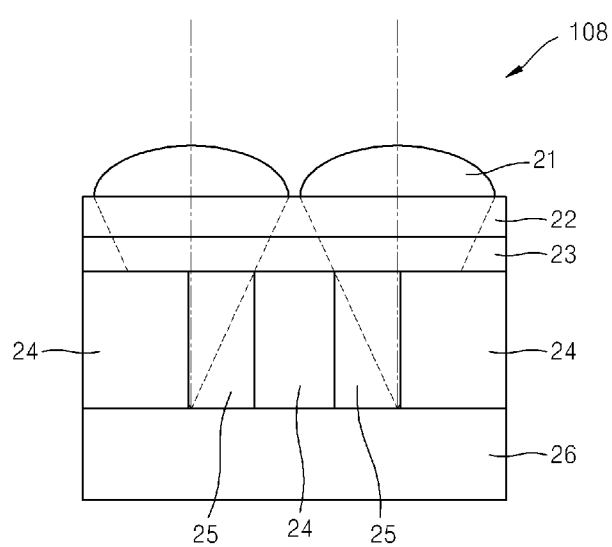
FIG. 6 is a diagram illustrating a structure of pixels constituting an imaging device, according to another embodiment.

FIG. 6 is a diagram illustrating a structure of pixels constituting the imaging device 108, according to another embodiment. In this embodiment, instead of formation of masks in the optical apertures of the imaging device 108, the wire layer 24 is disposed on one side of each pixel and thus a mask effect may be obtained.

When an imaging device is designed, an aperture ratio in each of pixels is generally restricted to about 40% because each pixel includes the wire layer 24. In FIG. 6, the wire layer 24 is disposed in an end portion of each pixel, thereby completing formation of pixels R and L serving as phase difference pixels. In this embodiment, however, the wire layer 24 needs to be configured for a pixel R and a pixel L. Thus, in an overall configuration, the wire layer 24 is disposed having a zigzag configuration.

Hereinafter, for convenience of explanation, an actual aperture ratio of pixels of 40% will be described as an aperture ratio of 100%. For example, an aperture ratio of 70% in the following description indicates an actual aperture ratio of 28%.

Figure 7A:
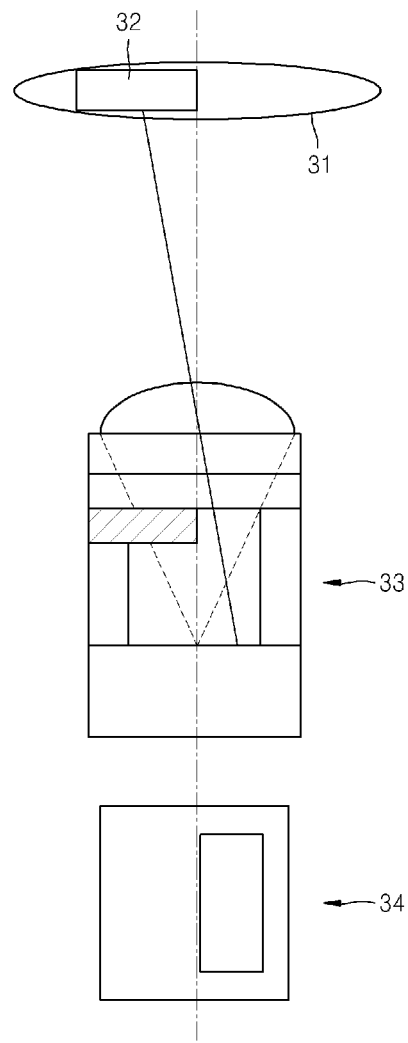
FIGS. 7A and 7B are diagrams illustrating a relationship between a position of masks of phase difference pixels of the imaging device of FIG. 5 and imaging lenses, according to an embodiment.
Figure 7B:
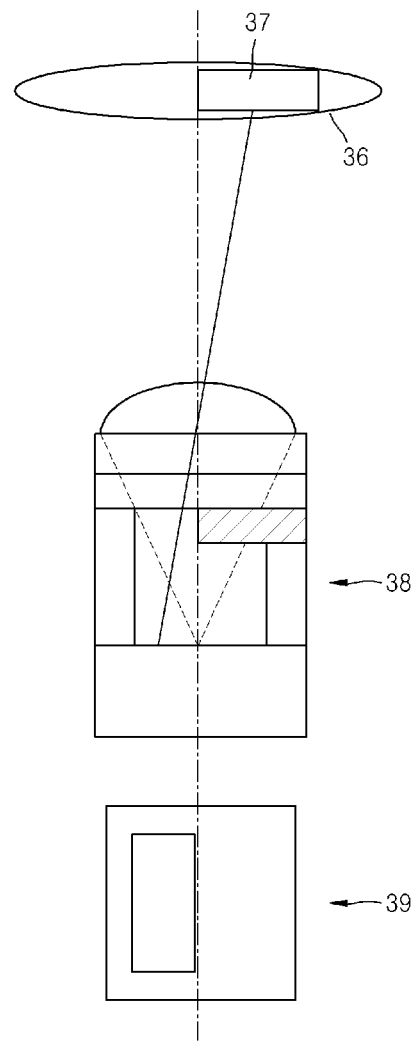

FIGS. 7A and 7B are diagrams illustrating a relationship between a position of masks of phase difference pixels of the imaging device of FIG. 5 and imaging lenses, according to an embodiment.

FIG. 7A illustrates an imaging lens 31, an R pixel 33 of the imaging device of FIG. 5, a top view of a mask 34, and a pupil 32 that is on the imaging lens 31 and incident on the mask 34. FIG. 7B illustrates an imaging lens 36, an L pixel 38 of the imaging device of FIG. 5, a top view of a mask 39, and a pupil 37 that is on the imaging lens 36 and incident on the mask 39.

Light that has transmitted through the pupil 32 of the imaging lens 31 or the pupil 37 of the imaging lens 36 is incident on the R pixel 33 or the L pixel 38, respectively. The masks 34 and 39 each have an aperture ratio of about 50% with respect to the optical axes of the imaging lenses 31 and 36. In other words, the R and L pixels 33 and 38 each have an aperture ratio of about 50% with respect to the optical axes of the imaging lenses 31 and 36, each optical aperture of which does not contact the optical axes or contacts but does not include the optical axes.

The R pixel 33 and the L pixel 38 illustrated in FIGS. 7A and 7B may not necessarily be arranged adjacent to each other. In addition, FIGS. 7A and 7B illustrate a configuration of pixels arranged in vicinity of the optical axes of the imaging lenses 31 and 36. If pixels are arranged further away from the optical axes of the imaging lenses 31 and 36, to correct the $\cos^4 \theta$ law, positions of the optical axes of the imaging lenses 31 and 36 and the masks 34 and 39 are shifted in an external direction of a screen.

Figures 8, 9A, 9B:
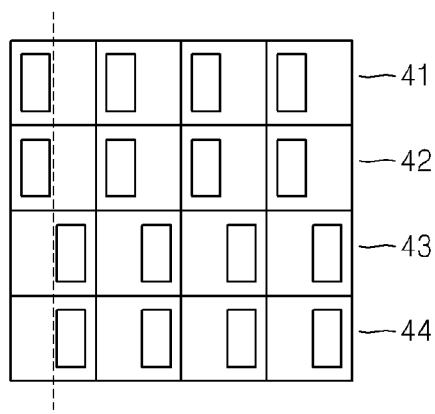
FIG. 8 illustrates a general Bayer pattern pixel structure of an imaging device.
FIGS. 9A and 9B illustrate phase difference pixels of the imaging device of FIGS. 7A and 7B configured in a horizontal direction based on the Bayer pattern pixel structure of FIG. 8, according to an embodiment.

FIG. 8 illustrates a general Bayer pattern pixel structure of an imaging device.

Referring to FIG. 8, color filters of three colors, i.e., red (R), green (G), and blue (B), are arranged and 4 pixels are configured as a single unit. In this regard, two G pixels are arranged in the unit.

FIGS. 9A and 9B illustrate phase difference pixels of the imaging device of FIGS. 7A and 7B configured in a horizontal direction based on the Bayer pattern pixel structure of FIG. 8, according to an embodiment.

FIG. 9A illustrates a configuration of a color filter and the R pixel 33 and a configuration of a color filter and the L pixel 38, and FIG. 9B illustrates arrangements of the masks 34 and 39. In FIG. 9A, RLa denotes that a mask for the L pixel 38 is formed in a red (R) color filter.

In FIGS. 9A and 9B, the R and L pixels 33 and 38 each have an aperture ratio of about 50% with respect to the optical axes of the imaging lenses 31 and 36, each optical aperture of which does not contact the optical axes or contacts but does not include the optical axes. In this regard, the masks 34 and 39 illustrated in FIG. 9B are referred to as an "A-type mask" for convenience of explanation, and thus a configuration of phase difference pixels in a horizontal direction is referred to as HA.

In FIGS. 9A and 9B, L pixels are arranged in a first row 41 and a second row 42, and R pixels are arranged in a third row 43 and a fourth row 44. Pixel row signals of each pixel of the first row 41 and the second row 42 or a sum (binning output) of pixel row signals of each L pixel of the first row 41 and each pixel of the second row 42, and pixel row signals of each pixel of the third row 43 and the fourth row 44 or a sum (binning output) of pixel row signals of each pixel of the third row 43 and the fourth row 44 are obtained as illustrated in FIGS. 3A and 3B to calculate a phase difference between the R and L pixels. In this regard, areas for obtaining binning output are not limited to the above example, and binning output with respect to wider areas may be performed. In addition, binning output may be performed on pixels of the same color. When binning output of pixels of the same color is obtained, the binning output may be used in a live view image. The pixel row signals are obtained as a line image in a horizontal direction. Thus, an image with a contrast change in a horizontal direction may be detected.

As described above, the HA is composed of pixels having an aperture ratio of about 50% with respect to the optical axes of the imaging lenses 31 and 36, each optical aperture of which does not contact the optical axes or contacts but does not include the optical axes, and thus crosstalk between adjacent pixels does not occur and a position of a focal point in a horizontal direction of a subject may be obtained from the phase difference information.

Figures 10A, 10B:
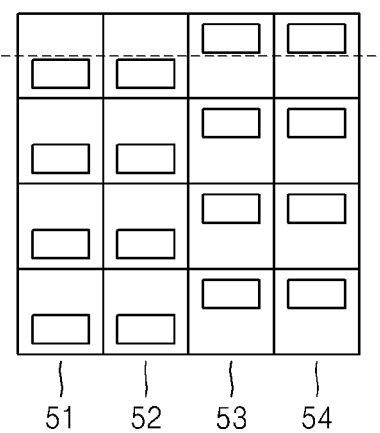
FIGS. 10A and 10B illustrate phase difference pixels of the imaging device of FIGS. 7A and 7B configured in a vertical direction based on the Bayer pattern pixel structure of FIG. 8, according to an embodiment.

FIGS. 10A and 10B illustrate phase difference pixels of the imaging device of FIGS. 7A and 7B configured in a vertical direction based on the Bayer pattern pixel structure of FIG. 8, according to an embodiment.

FIG. 10A illustrates a configuration of a color filter and the R pixel 33 and a configuration of a color filter and the L pixel 38, and FIG. 10B illustrates arrangements of the masks 34 and 39.

In FIGS. 10A and 10B, the R and L pixels 33 and 38 each have an aperture ratio of about 50% with respect to the optical axes of the imaging lenses 31 and 36, each optical aperture of which does not contact the optical axes or contacts but does not include the optical axes. In this regard, the masks 34 and 39 illustrated in FIG. 10B are referred to as an "A-type mask" for convenience of explanation, and thus a configuration of phase difference pixels in a vertical direction is referred to as VA.

In FIGS. 10A and 10B, L pixels are arranged in a first row 51 and a second row 52, and R pixels are arranged in a third row 53 and a fourth row 54. Pixel row signals of each pixel of the first row 51 and the second row 52 or a sum (binning output) of pixel row signals of each L pixel of the first row 51 and each pixel of the second row 52, and pixel row signals of each pixel of the third row 53 and the fourth row 54 or a sum (binning output) of pixel row signals of each pixel of the third row 53 and the fourth row 54 are obtained as illustrated in FIGS. 3A and 3B to calculate a phase difference between the R and L pixels.

The pixel row signals are obtained as a line image in a vertical direction. The pixel row signals of the VA may be used to detect an image with a contrast change in a vertical direction, and thus a position of a focal point in a vertical direction of a subject may be obtained from the phase difference information.

Figure 11A:
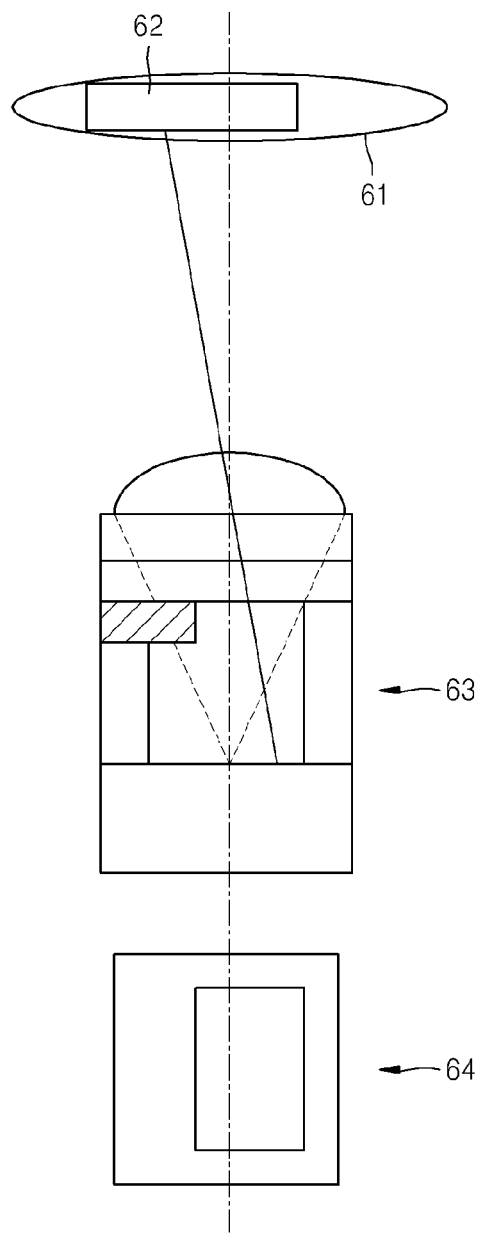
FIGS. 11A and 11B are diagrams illustrating a relationship between a position of masks of phase difference pixels and imaging lenses, according to another embodiment.
Figure 11B:
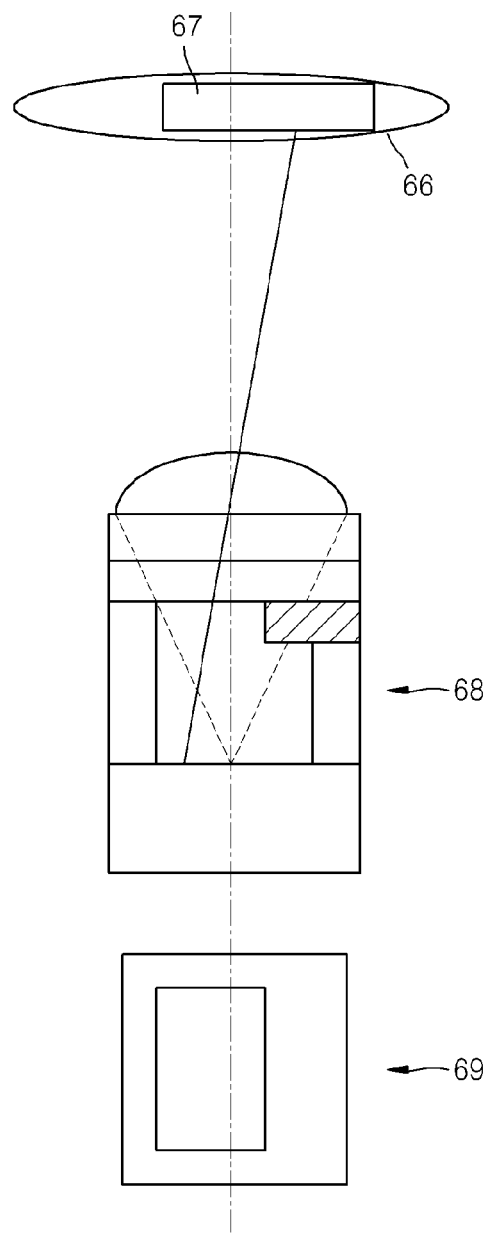

FIGS. 11A and 11B are diagrams illustrating a relationship between a position of masks of phase difference pixels and imaging lenses, according to another embodiment.

FIG. 11A illustrates an imaging lens 61, an R pixel 63 of the imaging device of FIG. 5, a top view of a mask 64, and a pupil 62 that is on the imaging lens 61 and incident on the mask 64. FIG. 11B illustrates an imaging lens 66, an L pixel 68 of the imaging device of FIG. 5, a top view of a mask 69, and a pupil 67 that is on the imaging lens 66 and incident on the mask 69.

Light that has transmitted through the pupil 62 of the imaging lens 61 and light that has transmitted through the pupil 67 of the imaging lens 66 are respectively incident on the R pixel 63 and the L pixel 68. While the masks 34 and 39 are respectively positioned to allow the R and L pixels 33 and 38 of the embodiment of FIGS. 7A and 7B to have an aperture ratio of 50% with respect to the optical axes, the masks 64 and 69 are respectively positioned to allow the R and L pixels 63 and 68 to have an aperture ratio of 50% or greater with respect to the optical axes, for example, 75%. In other words, in this embodiment, the R pixel 63 has an aperture ratio of 50% or greater with respect to the optical axis of the imaging lens 61, an optical aperture of which includes the optical axis, and the L pixel 68 has an aperture ratio of 50% or greater with respect to the optical axis of the imaging lens 66, an optical aperture of which includes the optical axis. The optical aperture of the R pixel 63 is centered to the right of the optical axis of the imaging lens 61, and the optical aperture of the L pixel 68 is centered to the left of the optical axis of the imaging lens 66.

In the R and L pixels 33 and 38 of FIGS. 7A and 7B, there is no overlapped portion between the pupils 32 and 37, and thus phase difference information thereof does not overlap each other, resulting in a relatively small autofocus (AF) error. On the other hand, darker images are obtained as compared with the R and L pixels 63 and 68 of FIGS. 11A and 11B. In contrast, in the R and L pixels 63 and 68 of FIGS. 11A and 11B, there is an overlapped portion between the pupils 62 and 67, and thus phase difference information thereof overlaps each other, resulting in a relatively large AF error. On the other hand, brighter images are obtained as compared with the R and L pixels 33 and 38 of FIGS. 7A and 7B.

Figures 12A, 12B, 13A, 13B:
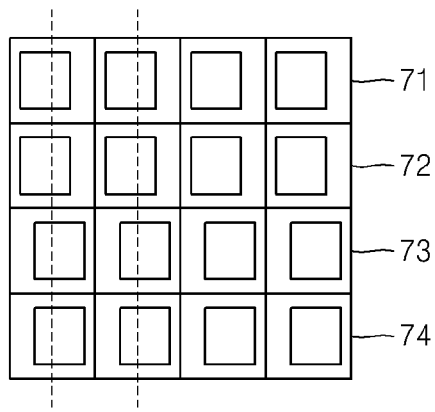
FIGS. 12A and 12B illustrate phase difference pixels of the imaging device of FIGS. 11A and 11B configured in a horizontal direction based on the Bayer pattern pixel structure of FIG. 8, according to an embodiment.
FIGS. 13A and 13B illustrate phase difference pixels of the imaging device of FIGS. 11A and 11B configured in a vertical direction based on the Bayer pattern pixel structure of FIG. 8, according to an embodiment.

FIGS. 12A and 12B illustrate phase difference pixels of the imaging device of FIGS. 11A and 11B configured in a horizontal direction based on the Bayer pattern pixel structure of FIG. 8, according to an embodiment.

FIG. 12A illustrates a configuration of a color filter and the R pixel 63 and a configuration of a color filter and the L pixel 68, and FIG. 12B illustrates arrangements of the masks 64 and 69.

While the R and L pixels illustrated in FIGS. 9A and 9B each have an aperture ratio of about 50% with respect to the optical axes of the imaging lenses 31 and 36, and the optical aperture of each pixel does not contact the optical axes or contacts but does not include the optical axes, the R and L pixels of FIGS. 12A and 12B each have an aperture ratio of about 75% with respect to the optical axes of the imaging lenses 61 and 66, and the optical aperture of each pixel includes the optical axes.

In this regard, the masks 64 and 69 are referred to as a "B-type mask" for convenience of explanation, and thus a configuration of phase difference pixels in a horizontal direction may be referred to as HB.

In FIGS. 12A and 12B, L pixels are arranged in a first row 71 and a second row 72, and R pixels are arranged in a third row 73 and a fourth row 74. Pixel row signals of each pixel of the first row 71 and the second row 72 or a sum (binning output) of pixel row signals of each L pixel of the first row 71 and each pixel of the second row 72, and pixel row signals of each pixel of the third row 73 and the fourth row 74 or a sum (binning output) of pixel row signals of each pixel of the third row 73 and the fourth row 74 are obtained as illustrated in FIGS. 3A and 3B to calculate a phase difference between the R and L pixels.

With respect to the HB of FIGS. 12A and 12B, the optical apertures of the HB are sufficiently big that images may be satisfactorily displayed by the imaging device. However, when phase difference detection is performed on the HB, the optical apertures of the HB each include the optical axes of the imaging lenses, and thus crosstalk between adjacent pixels occurs. In other words, L pixel information is included in shift information by the R pixels, and thus transverse shift information is included therein. Thus, it is difficult to obtain information on focal point position detection from phase difference information that may be obtained from the HB, but a focal direction of a subject may be obtained therefrom.

FIGS. 13A and 13B illustrate phase difference pixels of the imaging device of FIGS. 11A and 11B configured in a vertical direction based on the Bayer pattern pixel structure of FIG. 8, according to an embodiment.

FIG. 13A illustrates a configuration of a color filter and the R pixel 63 and a configuration of a color filter and the L pixel 68, and FIG. 13B illustrates arrangements of the masks 64 and 69. In FIG. 13A, RLb denotes that a mask for the L pixel 68 is formed in a red (R) color filter.

While the R and L pixels illustrated in FIGS. 9A and 9B each have an aperture ratio of about 50% with respect to the optical axes of the imaging lenses 31 and 36, and the optical aperture of each pixel does not contact the optical axes or contacts but does not include the optical axes, the R and L pixels of FIGS. 13A and 13B each have an aperture ratio of about 75% with respect to the optical axes of the imaging lens 61 and 66, and the optical aperture of each pixel includes the optical axes.

In this regard, the masks 64 and 69 are referred to as a "B-type mask" for convenience of explanation, and thus a configuration of phase difference pixels in a vertical direction may be referred to as VB.

In FIGS. 13A and 13B, L pixels are arranged in a first row 81 and a second row 82, and R pixels are arranged in a third row 83 and a fourth row 84. Pixel row signals of each pixel of the first row 81 and the second row 82 or a sum (binning output) of pixel row signals of each L pixel of the first row 81 and each pixel of the second row 82, and pixel row signals of each pixel of the third row 83 and the fourth row 84 or a sum (binning output) of pixel row signals of each pixel of the third row 83 and the fourth row 84 are obtained as illustrated in FIGS. 3A and 3B to calculate a phase difference between the R and L pixels.

Phase difference information that may be obtained from the VB may be used to obtain a focal direction of a subject, like the HB of FIGS. 12A and 12B.

Figures 14A, 14B:
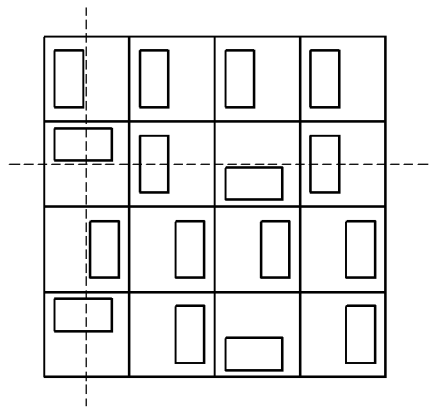
FIGS. 14A and 14B illustrate phase difference pixels of the imaging device of FIGS. 7A and 7B configured in horizontal and vertical directions based on the Bayer pattern pixel structure of FIG. 8, according to an embodiment.

FIGS. 14A and 14B illustrate phase difference pixels of the imaging device of FIGS. 7A and 7B configured in horizontal and vertical directions based on the Bayer pattern pixel structure of FIG. 8, according to an embodiment.

The R and L pixels each have an aperture ratio of 50%, and thus a focal direction may be obtained. A configuration of phase difference pixels in horizontal and vertical directions is referred to as HVA. In the HVA configuration, G pixels that are greater in number than R and B pixels are used as a detection pixel in horizontal and vertical directions.

Figure 15:
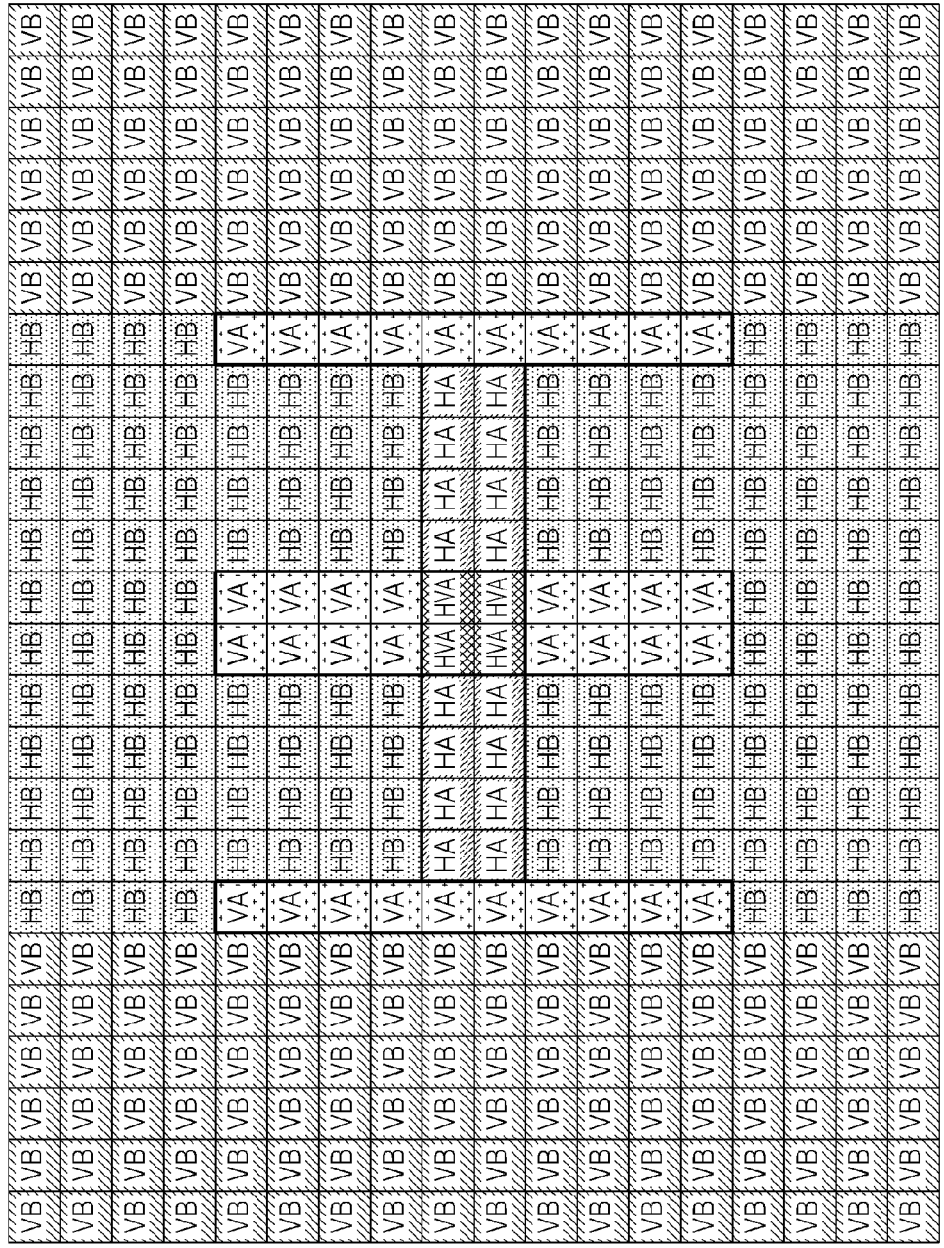
FIG. 15 illustrates a combined configuration of the phase difference pixels of the imaging devices of FIGS. 9A, 9B, 10A, 10B, 13A, 13B, 14A, and 14B, according to an embodiment.

FIG. 15 illustrates a combined configuration of the phase difference pixels of the imaging devices of FIGS. 9A, 9B, 10A, 10B, 13A, 13B, 14A, and 14B, according to an embodiment.

Actually, an imaging device may be, for example, a 14.6M pixel imaging device having a pixel configuration in which 4670 pixels are arranged in a horizontal direction and 3100 pixels are arranged in a vertical direction. In this embodiment, however, smaller pixels are arranged for explanation in diagram form.

Referring to FIG. 15, HAs and VAs are arranged at a center area of an imaging device, and HVAs are arranged where HAs and VAs cross each other. VBs are arranged at left and right regions of the center area, and HBs are arranged in the vicinity of the center area other than the areas where the HAs, the VAs, and the HVAs are arranged. In this regard, the VAs are arranged around the HBs.

The arrangement of the HAs and HBs at the center area of the imaging device, which is an optical condition for pupils of the imaging device, is for preventing a vignetting phenomenon. For example, a lens with an aperture of F6.7 or less may obtain high focal position detection accuracy because an optical vignetting phenomenon does not occur. Since the optical vignetting phenomenon occurs at an area other than the center area of the imaging device, HBs and VBs for focal direction detection, which do not cause problems in terms of density, are arranged. Since the optical vignetting phenomenon increases according to a distance from an optical axis of an imaging lens and it is desirable that R and L pixels are relatively symmetrically arranged in spite of the occurrence of the vignetting phenomenon, the HBs are arranged at the center area and upper and lower areas of the imaging device and the VBs are arranged at left and right areas of the imaging device. Furthermore, in an actual imaging device, VAs are arranged in the HB configuration instead of HAs.

In imaging devices to be described later, phase difference pixels for focal position detection may also be discretely arranged in a configuration of phase difference pixels for focal direction detection, such as HB pixels or VB pixels.

In addition, in the digital image processing device 100, HAs and VAs for focal position detection are primarily used during AF, and HBs and VBs for focal direction detection are used in an auxiliary manner.

Figure 16:
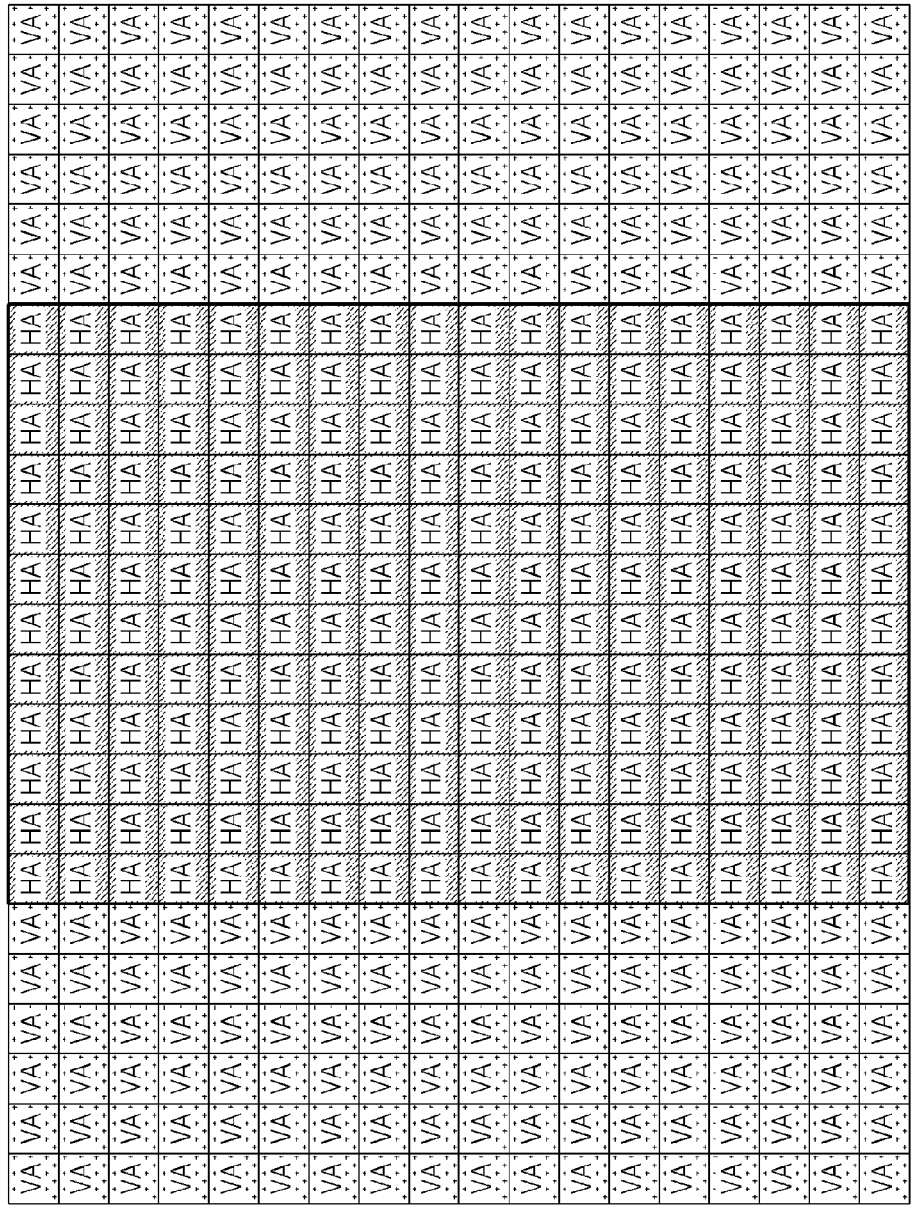
FIG. 16 illustrates a configuration of the phase difference pixels of the imaging device of FIGS. 14A and 14B, according to an embodiment.

FIG. 16 illustrates a configuration of the phase difference pixels of the imaging device of FIGS. 14A and 14B, according to an embodiment.

Referring to FIG. 16, HAs are arranged at a center area of an imaging device, and VAs are arranged at an area other than the center area.

The pixels of the imaging device of FIG. 6 in which the wire layers are disposed in a zigzag configuration may have the pixel configuration of FIG. 16. The imaging device may have the same image quality as that of a general imaging device, and thus a focal position may be detected using all the pixels at once. In this regard, the wire layers of the R and L pixels are disposed in a zigzag configuration.

Figure 17:
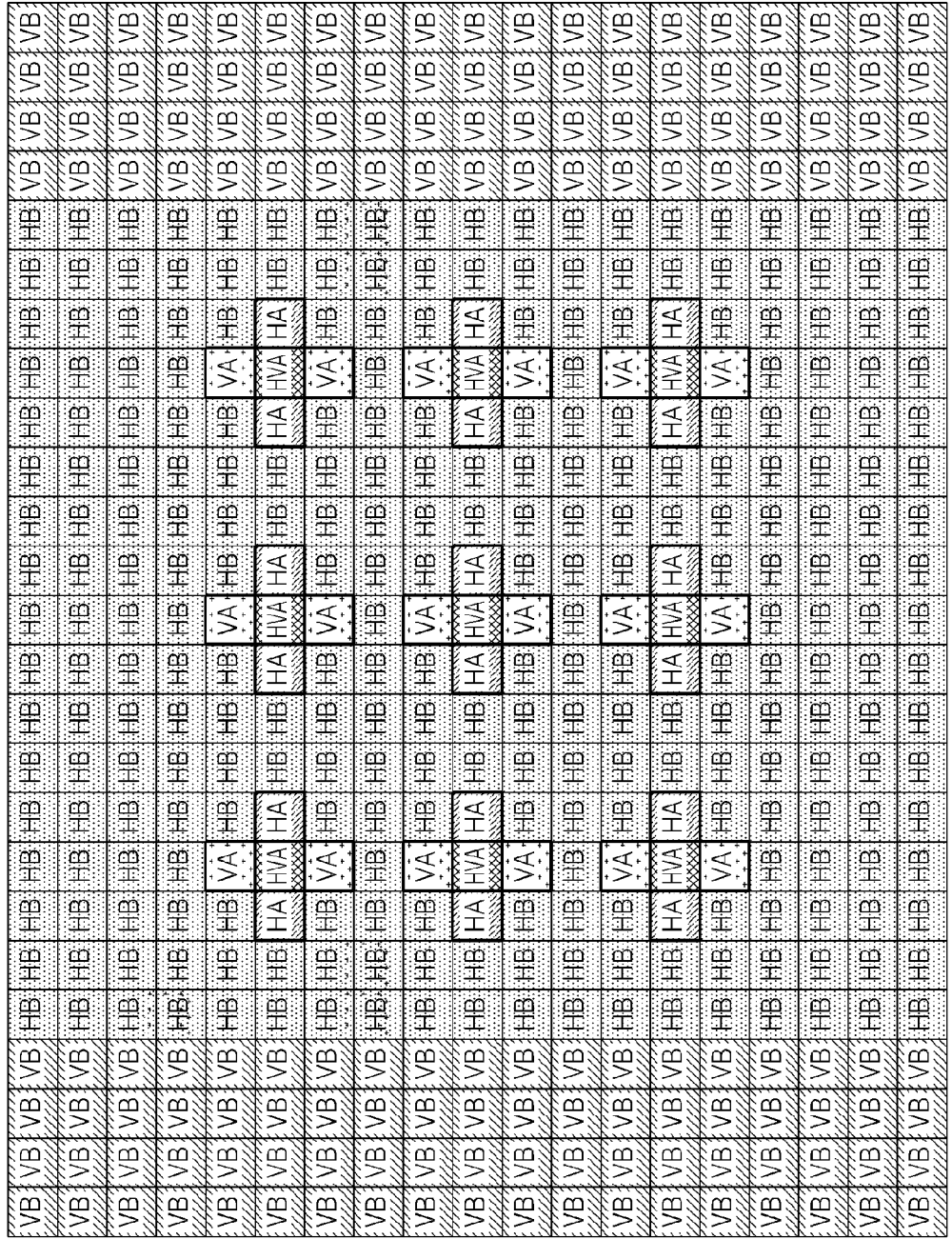
FIG. 17 illustrates a combined configuration of the phase difference pixels of the imaging devices of FIG. 15, according to another embodiment.

FIG. 17 illustrates a combined configuration of the phase difference pixels of the imaging devices of FIG. 15, according to another embodiment.

Referring to FIG. 17, the pixels are configured in such a manner that detection in horizontal and vertical directions is performed in each area of the imaging device. Multi-point detection may be performed at nine points composed of HAs, VAs, HVAs, and HBs arranged at a central area of an imaging device.

A detailed description of the imaging device for phase difference detection including an imaging lens with an aperture of F6.7 or less has been provided. A bright imaging lens has decreased focal position detection accuracy. With respect to a lens with an aperture of more than F2.8, the imaging device includes phase difference pixels with high focal position detection accuracy.

Figure 18:
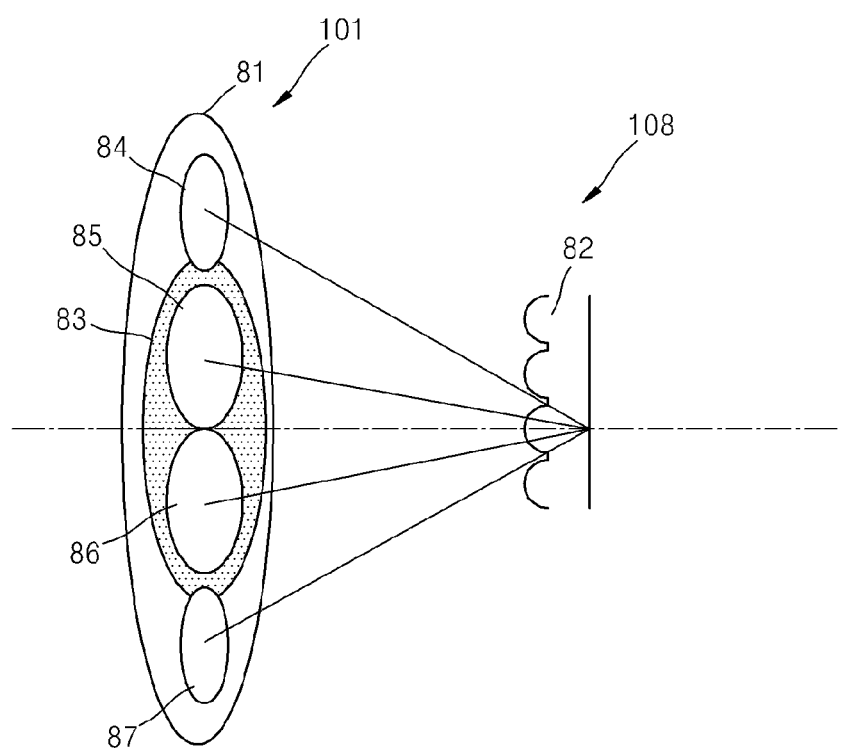
FIG. 18 is a diagram for explaining a principle of phase difference pixels with high focal position detection accuracy, according to an embodiment.

FIG. 18 is a diagram for explaining a principle of phase difference pixels with high focal position detection accuracy, according to an embodiment.

Referring to FIG. 18, positions of an imaging lens and exit pupils of the imaging lens are illustrated as in FIG. 2. In FIG. 18, an exit pupil 81 for F2.8 of the imaging lens, a micro lens 82, an exit pupil 83 for F6.7, a pupil 86 for a phase difference R pixel in the exit pupil 83 for F6.7, a pupil 85 for a phase difference L pixel in the exit pupil 83 for F6.7, a pupil 87 for a phase difference R pixel in the exit pupil 81 for F2.8, and a pupil 84 for a phase difference L pixel in the exit pupil 81 for F2.8 are illustrated.

The pupils 84 and 87 for F2.8 are positioned at a distance from an optical axis of the imaging lens. In this case, an angle of light incident on phase difference pixels increases, and when a focal point of the light is changed, there is a big change in a position of image formation. Thus, in such a configuration in which an incident angle of light increases, a phase difference change is detected at a high level, and thus focal position detection accuracy is high.

Figure 19A:
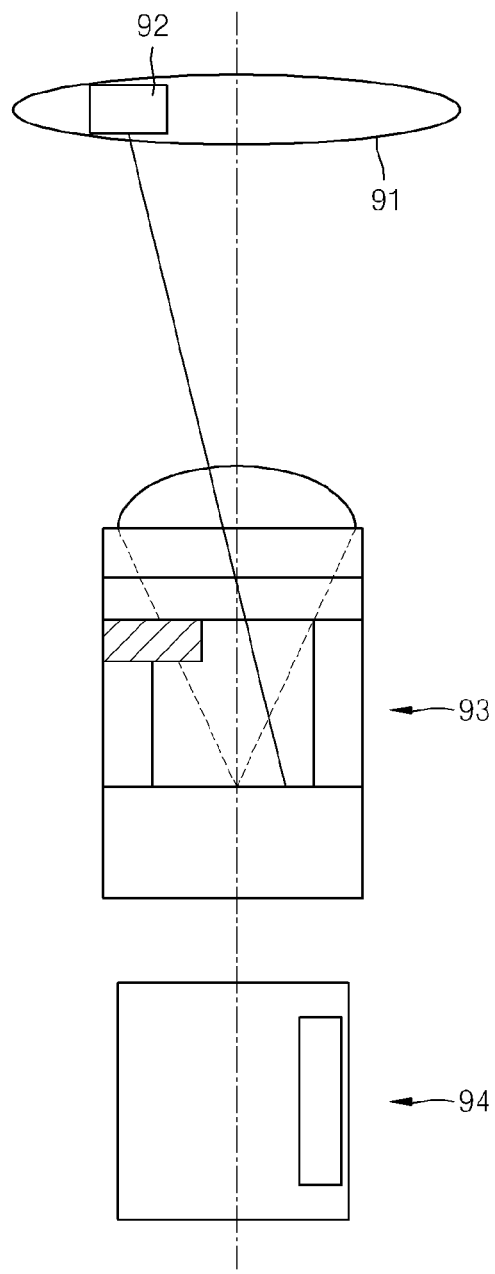
FIGS. 19A and 19B are diagrams illustrating a relationship between a position of masks of phase difference pixels and F2.8 imaging lenses, according to an embodiment.
Figure 19B:
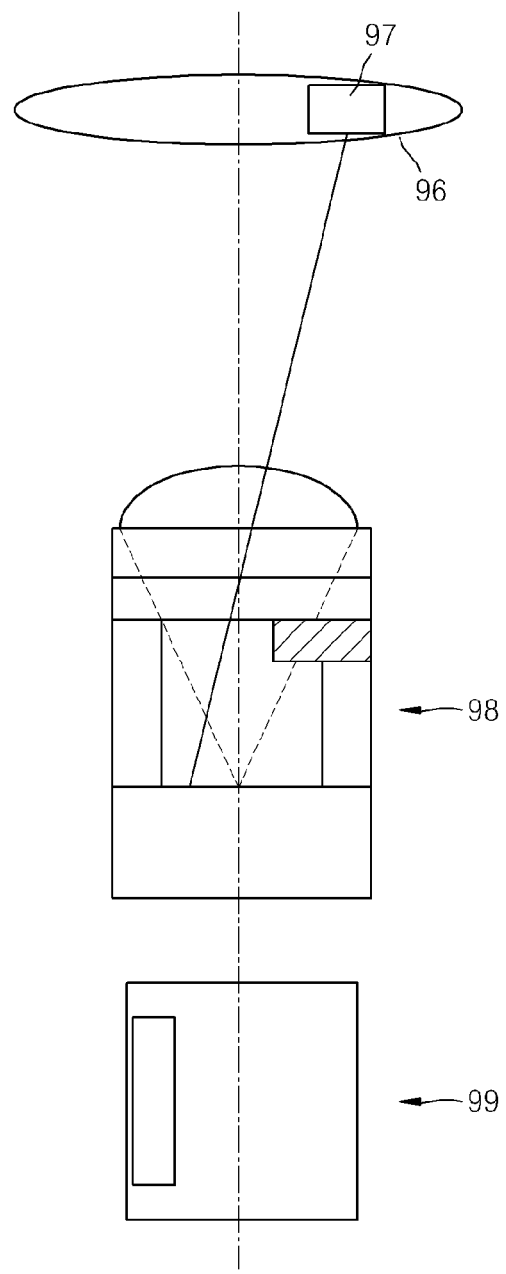

FIGS. 19A and 19B are diagrams illustrating a relationship between a position of masks of phase difference pixels and imaging lenses for F2.8, according to an embodiment.

FIG. 19A illustrates an imaging lens 91, an R pixel 93, a top view of a mask 94, and a pupil 92 that is on the imaging lens 91 and incident on the mask 94. FIG. 19B illustrates an imaging lens 96, an L pixel 98, a top view of a mask 99, and a pupil 97 that is on the imaging lens 96 and incident on the mask 99.

Light that has transmitted through the pupil 92 of the imaging lens 91 or the pupil 97 of the imaging lens 96 is incident on the R pixel 93 or the L pixel 98, respectively. While the masks 34 and 39 illustrated in FIGS. 7A and 7B are respectively positioned to allow the R and L pixels 33 and 38 to have an aperture ratio of 50% with respect to the optical axes, the masks 94 and 99 illustrated in FIGS. 19A and 19B are respectively positioned to allow the R and L pixels 93 and 98 to have an aperture ratio of 25% with respect to optical axes of the imaging lenses 91 and 96. In this regard, optical apertures of the R and L pixels 93 and 98 are respectively positioned at a distance further from the optical axes of the imaging lenses 91 and 96, as compared to pixels for F6.7. Furthermore, when the size of pixels increases, optical apertures of the pixels are not made smaller in size, but the optical apertures may be positioned at a distance further from an optical axis of an imaging lens.

Figures 20A, 20B:
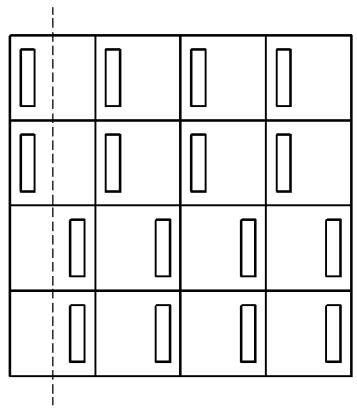
FIGS. 20A and 20B illustrate phase difference pixels of the imaging device of FIGS. 19A and 19B configured in a horizontal direction by using the F2.8 imaging lenses of FIGS. 19A and 19B, according to an embodiment.

FIGS. 20A and 20B illustrate phase difference pixels of the imaging device of FIGS. 19A and 19B configured in a horizontal direction by using the F2.8 imaging lenses of FIGS. 19A and 19B, according to an embodiment.

FIG. 20A illustrates a configuration of a color filter and the R pixel 93 and a configuration of a color filter and the L pixel 98, and FIG. 20B illustrates arrangements of the masks 94 and 99.

Referring to FIGS. 20A and 20B, the R and L pixels 93 and 98 each have an aperture ratio of about 25%, each optical aperture of which does not include or contact the optical axes of the imaging lenses 91 and 96, and the optical apertures of the R and L pixels 93 and 98 are respectively positioned at a distance from the optical axes of the imaging lenses 91 and 96. A configuration of phase difference pixels in a horizontal direction as illustrated in FIGS. 20A and 20B is referred to as HA25.

Phase difference information that may be obtained from HA25 is focal position detection information, and focal position detection information may be obtained with high accuracy. Although not illustrated in FIGS. 20A and 20B, phase difference pixels may also be configured in a vertical direction, and such a configuration is referred to as VA25.

Figure 21:
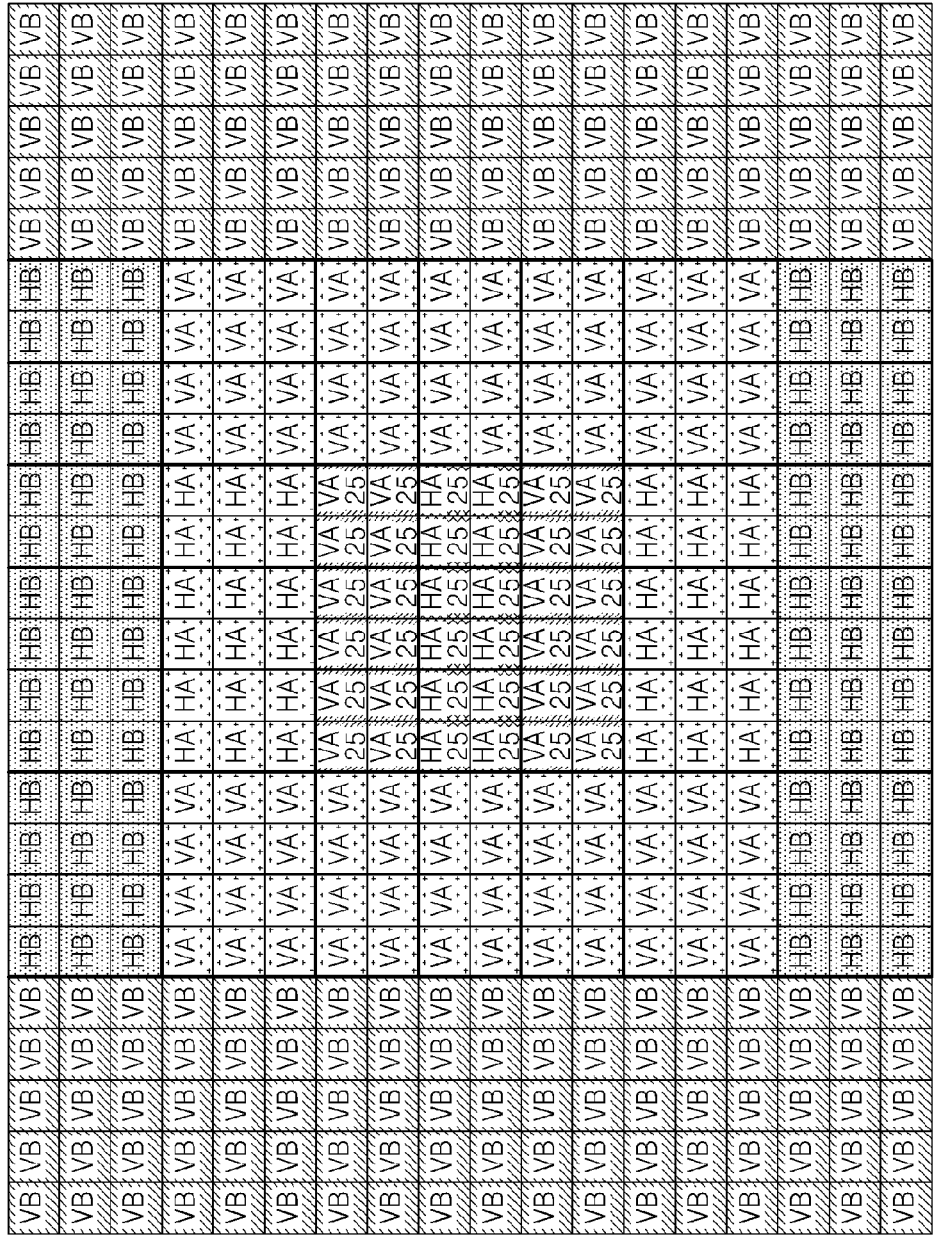
FIG. 21 illustrates a combined configuration of the phase difference pixels of the imaging devices of FIGS. 9A, 9B, 20A, and 20B, according to an embodiment.

FIG. 21 illustrates a combined configuration of the phase difference pixels of the imaging devices of FIGS. 9A, 9B, 20A, and 20B, according to an embodiment.

Referring to FIG. 21, a plurality of HA25s are arranged at a central area of an imaging device, and a plurality of VA25s are arranged on upper and lower sides of the central area. Although not illustrated in FIG. 21, HAs are interposed between the HA25s and the VA25s. The plurality of HA25s may be arranged at the central area of the imaging device if a lens system that is brighter than an F2.8 lens is used, while the HAs may be arranged if a lens system using other lenses is used.

HAs are arranged on upper and lower sides of the area in which the plurality of VA25s are arranged, and VAs are arranged on and right sides of the areas in which the plurality of VA25s, the plurality of HA25s, and the HAs are arranged. In addition, HBs are arranged on upper and lower sides of the areas in which the HAs and the VAs are arranged, and VBs are arranged on left and right sides of the areas in which the HBs and the VAs are arranged.

In other words, FIG. 21 illustrates a configuration of F2.8 and F6.7 phase difference pixels for focal position detection arranged at a central area of an imaging device, a configuration of F6.7 phase difference pixels for focal position detection arranged at an outer side of the central area, and a configuration of phase difference pixels for focal direction detection arranged at an outermost side of the central area.

FIGS. 22A and 22B illustrate the phase difference pixels illustrated in FIGS. 19A and 19B configured in a horizontal direction, according to another embodiment.

FIG. 22A illustrates a configuration of a color filter and the R pixel 93 and a configuration of a color filter and the L pixel 98, and FIG. 22B illustrates arrangements of the masks 94 and 99.

In FIGS. 22A and 22B, phase difference pixels for focal direction detection configured to have an aperture ratio of 70% are illustrated, and such a configuration is referred to as HB70. Although not illustrated in FIGS. 22A and 22B, phase difference pixels may also be configured in a vertical direction, and such a configuration is referred to as VB70.

FIGS. 23A and 23B illustrate the phase difference pixels illustrated in FIGS. 19A and 19B configured in a horizontal direction, according to another embodiment.

FIG. 23A illustrates a configuration of a color filter and the R pixel 93 and a configuration of a color filter and the L pixel 98, and FIG. 23B illustrates arrangements of the masks 94 and 99.

In FIGS. 23A and 23B, phase difference pixels for focal direction detection configured to have an aperture ratio of 85% are illustrated, and such a configuration is referred to as HB85. Although not illustrated in FIGS. 23A and 23B, phase difference pixels may also be configured in a vertical direction, and such a configuration is referred to as VB85.

Figure 24:
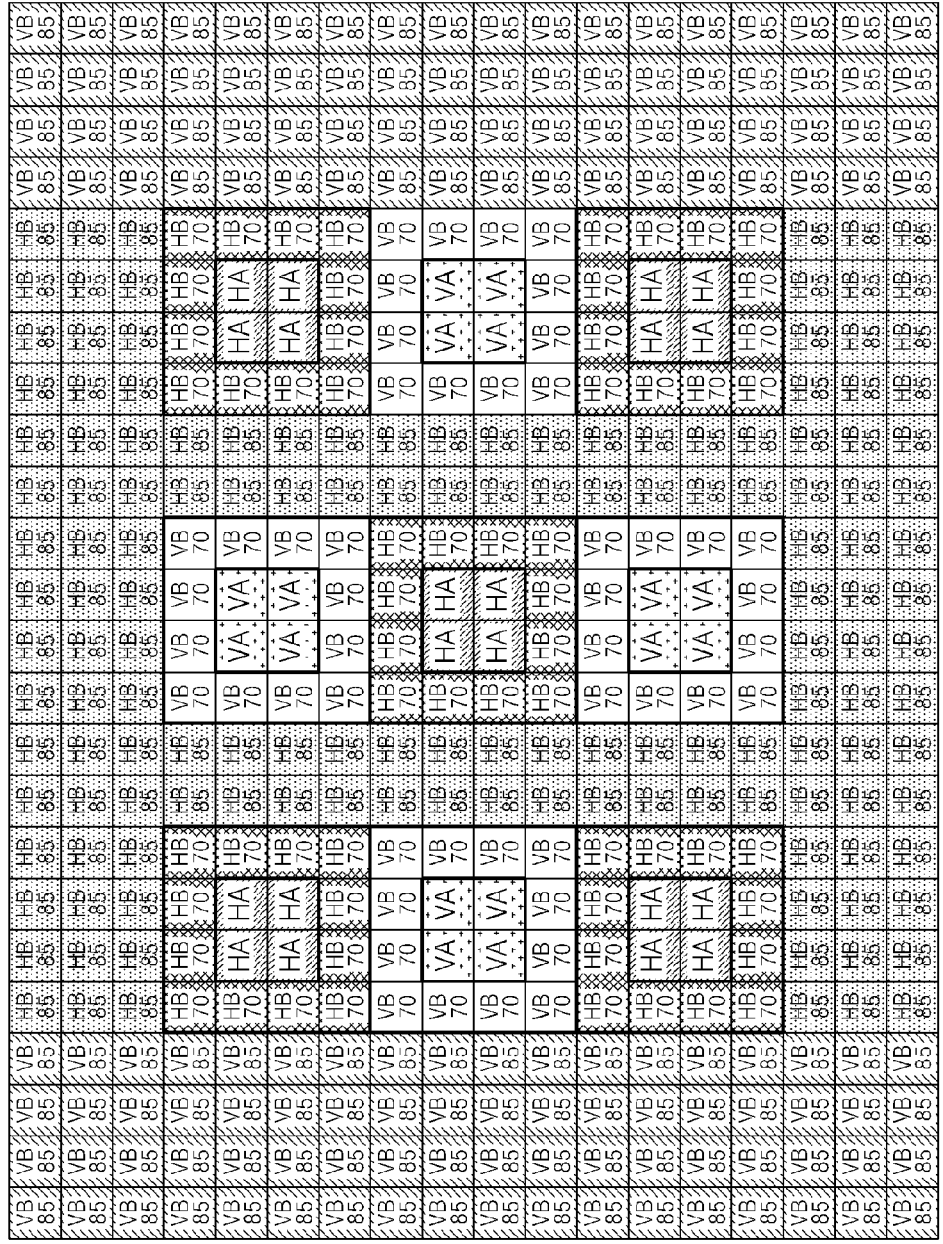
FIG. 24 illustrates a combined configuration of the phase difference pixels illustrated in FIGS. 22A, 22B, 23A, and 23B, according to an embodiment.

FIG. 24 illustrates a combined configuration of the phase difference pixels illustrated in FIGS. 22A, 22B, 23A, and 23B, according to an embodiment.

Referring to FIG. 24, HAs are arranged at a central area of an imaging device, and the HAs are also arranged at a left upper side, a right upper side, a left lower side, and a right lower side of the central area. A plurality of HB70s are arranged around the areas in which the HAs are arranged. VAs are arranged on a left side, a right side, an upper side, and a lower side of the central area, a plurality of VB70s are arranged therearound, a plurality of HB85s are arranged between the areas in which the plurality of HB70s and the plurality of VB70s are arranged, and a plurality of VB85s are arranged on left and right sides of the areas in which the plurality of HB85s, the plurality of HB70s, and a plurality of VB70s are arranged.

Such a configuration may be made considering the quality of captured images, and made to improve an aperture ratio of edge regions. An imaging device including such a configuration has an effect of correcting shading by an imaging lens, and may exhibit a focal position detection ability and increased quality of images.

FIGS. 25A and 25B illustrate the phase difference pixels illustrated in FIGS. 19A and 19B configured in a horizontal direction, according to another embodiment.

FIG. 25A illustrates a configuration of a color filter and the R pixel 93 and a configuration of a color filter and the L pixel 98, and FIG. 25B illustrates arrangements of the masks 94 and 99. In FIG. 25A, only G pixels are configured as phase difference pixels for focal position detection, and R and B pixels are configured as phase difference pixels for focal direction detection. Such a configuration is referred to as HC. Although the G pixels have a smaller aperture ratio than the R and B pixels, the number of G pixels is twice that of either of the R and B pixels, and thus degradation of image quality may not occur.

FIGS. 26A and 26B illustrate the phase difference pixels of FIGS. 25A and 25B configured in a vertical direction, according to an embodiment. FIG. 26A illustrates a configuration of a color filter and the R pixel 93 and a configuration of a color filter and the L pixel 98, and FIG. 26B illustrates arrangements of the masks 94 and 99. Such a configuration is referred to as VC.

Figure 27:
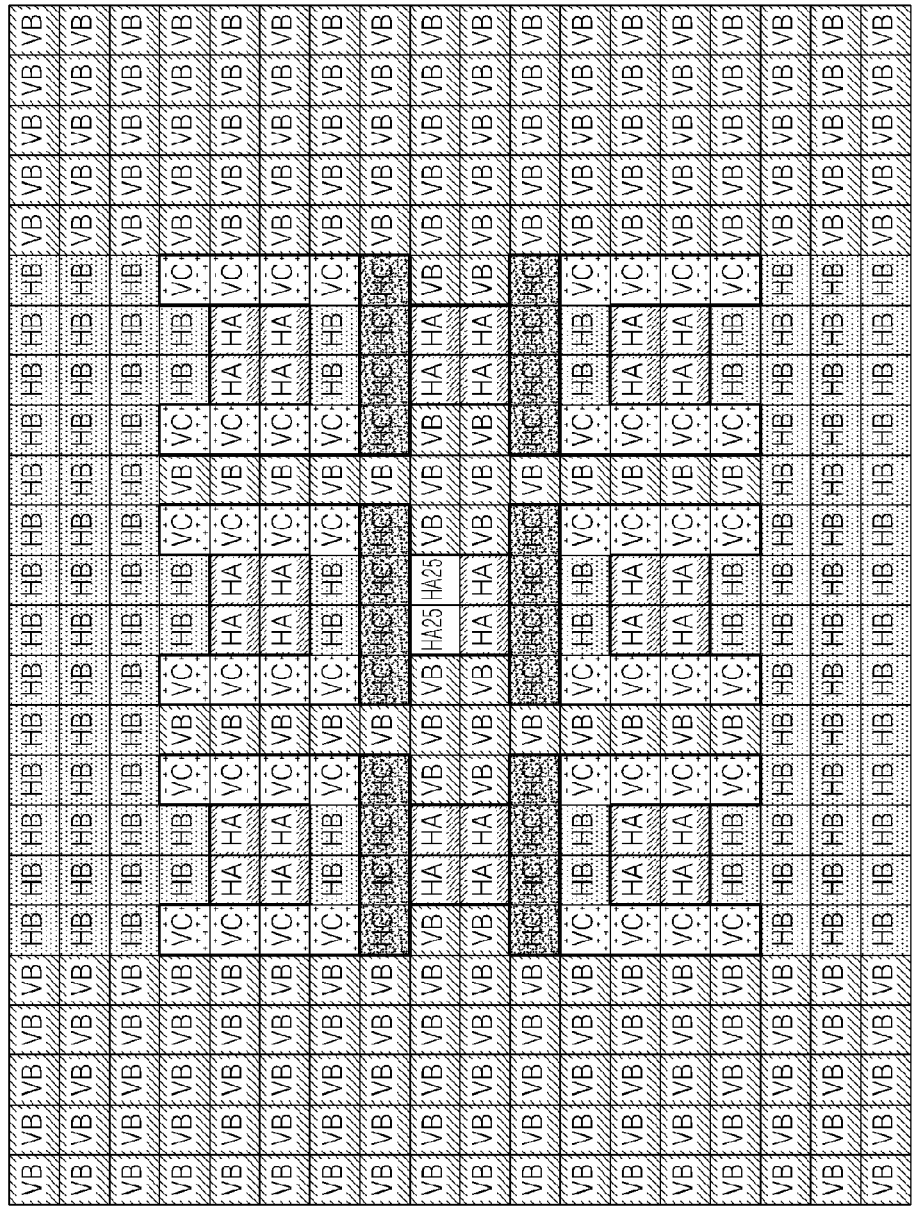
FIG. 27 illustrates a combined configuration of the phase difference pixels of FIGS. 25A, 25B, 26A, and 26B, according to an embodiment.

FIG. 27 illustrates a combined configuration of the phase difference pixels of FIGS. 25A, 25B, 26A, and 26B, according to an embodiment.

Such a configuration in FIG. 27 may be made considering the quality of captured images rather than considering an imaging device itself. HAs are arranged at nine areas including a central area of an imaging device, HAs and a plurality of HA25s are both arranged at the central area, HCs are arranged between the areas in which the HAs are arranged, and VCs are arranged at 12 areas on left and right sides of the areas in which the HAs are arranged. This is a basic configuration. VBs are arranged between the areas in which the HAs and the VCs are arranged. HBs are arranged on upper and lower sides of the basic configuration, and VBs are arranged on left and right sides of the basic configuration.

The configuration of FIG. 27 may be made for detecting multifocal points corresponding to several subjects, and an imaging device including such a configuration may have good image quality.

Figure 28:
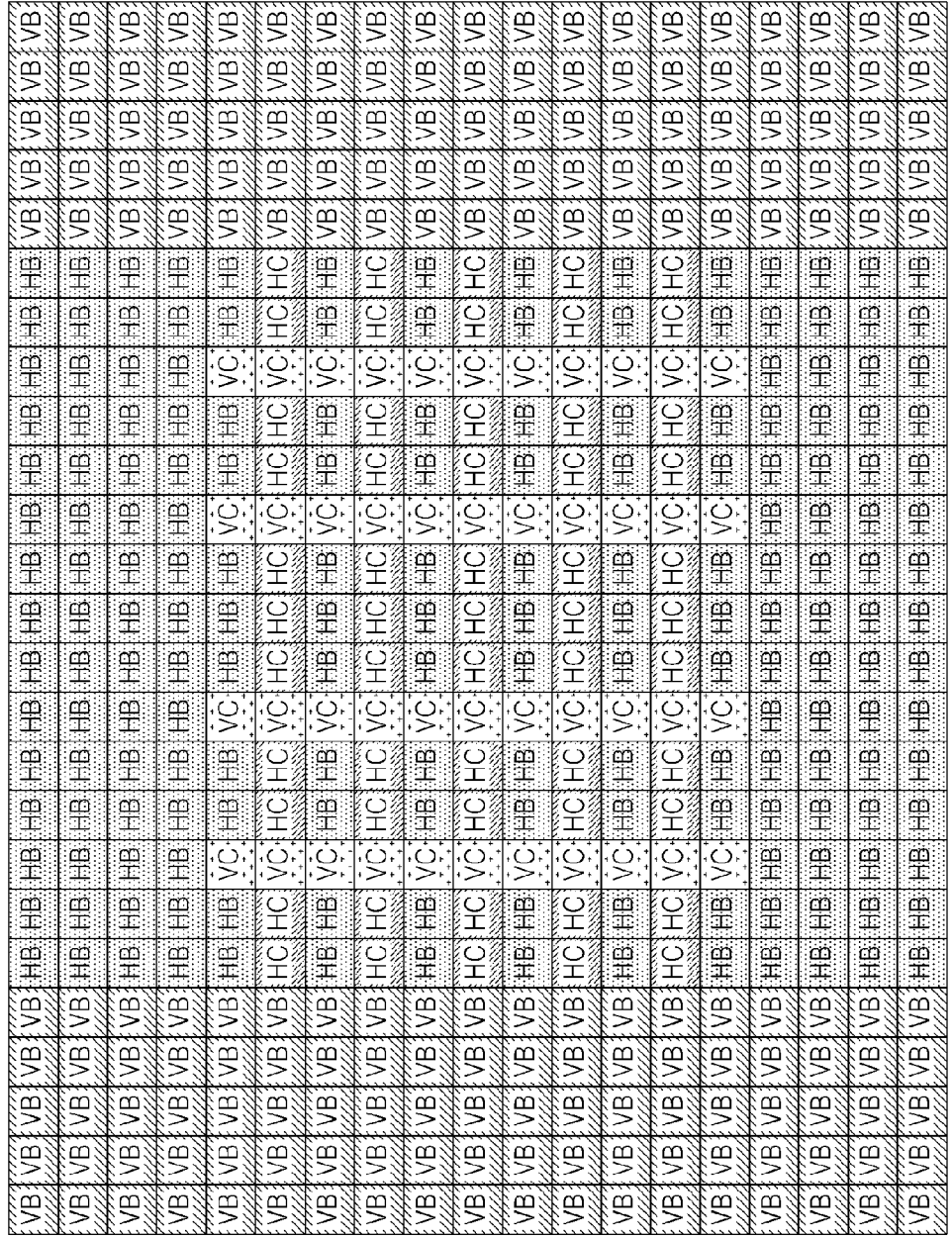
FIG. 28 illustrates a combined configuration of the phase difference pixels of FIG. 27, according to another embodiment.

FIG. 28 illustrates a combined configuration of the phase difference pixels of FIG. 27, according to another embodiment.

HCs are arranged at a central area and HCs are further arranged in multi-lines on upper and lower sides of the central area, and VCs are arranged in multi-lines where the HCs and the VCs cross each other. HBs are arranged between the areas in which the HCs and the VCs are arranged. VBs are arranged on outermost left and right sides of the imaging device. An imaging device having such a configuration may set a focal point detection area at any position by setting multifocal point detection scores using software and thus may be used widely.

Figures 29A, 29B:
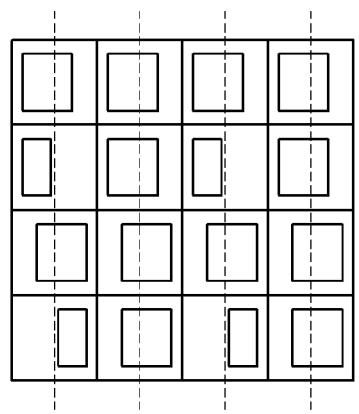
FIGS. 29A and 29B illustrate a configuration of the phase difference pixels of FIGS. 25A and 25B, according to another embodiment.

FIGS. 29A and 29B illustrate a configuration of the phase difference pixels of FIGS. 25A and 25B, according to another embodiment.

Referring to FIGS. 29A and 29B, one of the G pixels in the Bayer pattern pixel structure is replaced by a white (W) pixel. In other words, one of the two G pixels of the Bayer pattern pixel structure is removed. The W pixels are configured as phase difference pixels in a horizontal direction for focal position detection, and R, G, and B pixels are configured as phase difference pixels in a horizontal direction for focal direction detection. The configuration of the imaging device illustrated in FIGS. 29A and 29B is referred to as HAW. Although not illustrated in FIGS. 29A and 29B, phase difference pixels may be configured in a vertical direction, and such a configuration is referred to as VAW. In addition, the imaging device may have a configuration in which the HCs and the VCs of FIGS. 27 and 28 are replaced by HAWs and VAWs.

The configuration of phase difference pixels described above is used to detect phase difference in a horizontal or vertical direction. However, phase difference pixels may be arranged in a concentric circle with respect to an optical axis of an imaging lens to detect phase difference. By using such a configuration, symmetry of a subject may be easily obtained. In this case, focal position detection error with respect to light from a pupil of an imaging lens is small. In addition, with respect to a subject with contrast that is distributed slantingly, there is a possibility of error occurrence in focal position detection by error occurrence in fabrication of a mask formed in an optical aperture of a pixel. FIGS. 30A through 33B illustrate configurations of phase difference pixels arranged in an inclined direction, wherein phase difference information may be detected with respect to the inclined direction, according to various embodiments.

Figures 30A, 30B:
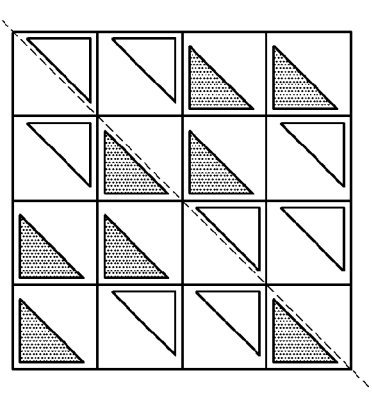
FIGS. 30A and 30B illustrate an MA configuration of phase difference pixels for detecting a focal position by detecting phase difference with respect to right, upper, left, and lower directions, according to an embodiment.

FIGS. 30A and 30B illustrate an MA configuration of phase difference pixels for detecting a focal position by detecting phase difference with respect to right, upper, left, and lower directions, according to an embodiment. MA denotes a D pixel row that corresponds to the L pixel illustrated in FIG. 2. Phase difference calculation is performed using GDa, RDa, GDa, BDa, GDa, RDa, GDa, . . . , and phase difference calculation is performed using BUa, GUa, RUa, GUa, BUa, . . . , that is, a U pixel row corresponding to the R pixel illustrated in FIG. 2.

Figures 31A, 31B:
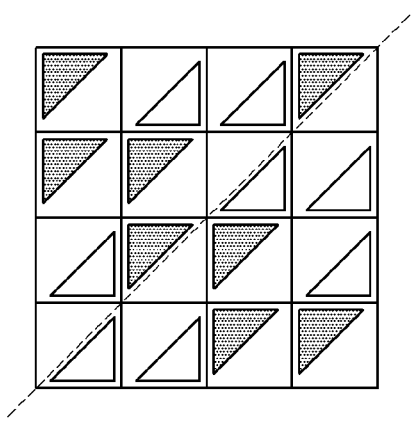
FIGS. 31A and 31B illustrate an NA configuration of phase difference pixels for detecting a focal position by detecting phase difference with respect to left, upper, right, and lower directions, according to an embodiment.

FIGS. 31A and 31B illustrate an NA configuration of phase difference pixels for detecting a focal position by detecting phase difference with respect to left, upper, right, and lower directions, according to an embodiment. The NA configuration is made in a direction converse to the MA configuration.

Figures 32A, 32B:
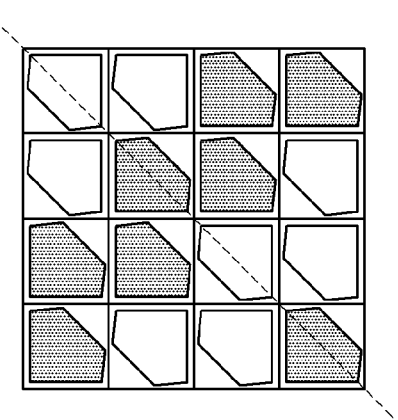
FIGS. 32A and 32B illustrate an MB configuration of phase difference pixels for detecting a focal direction by detecting phase difference with respect to right, upper, left, and lower directions, according to an embodiment.

FIGS. 32A and 32B illustrate an MB configuration of phase difference pixels for detecting a focal direction by detecting phase difference with respect to right, upper, left, and lower directions, according to an embodiment. The MB configuration has an aperture ratio of more than 50%, an optical aperture of which includes an optical axis of an imaging lens.

Figures 33A, 33B:
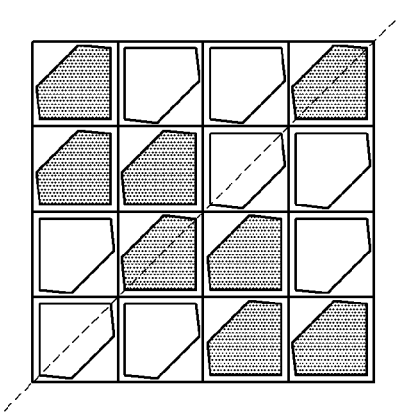
FIGS. 33A and 33B illustrate an NB configuration of phase difference pixels for detecting a focal direction by detecting phase difference with respect to left, upper, right, and lower directions, according to an embodiment.

FIGS. 33A and 33B illustrate an NB configuration of phase difference pixels for detecting a focal direction by detecting phase difference with respect to left, upper, right, and lower directions, according to an embodiment. The NB configuration is made in a direction converse to the MB configuration.

Figure 34:
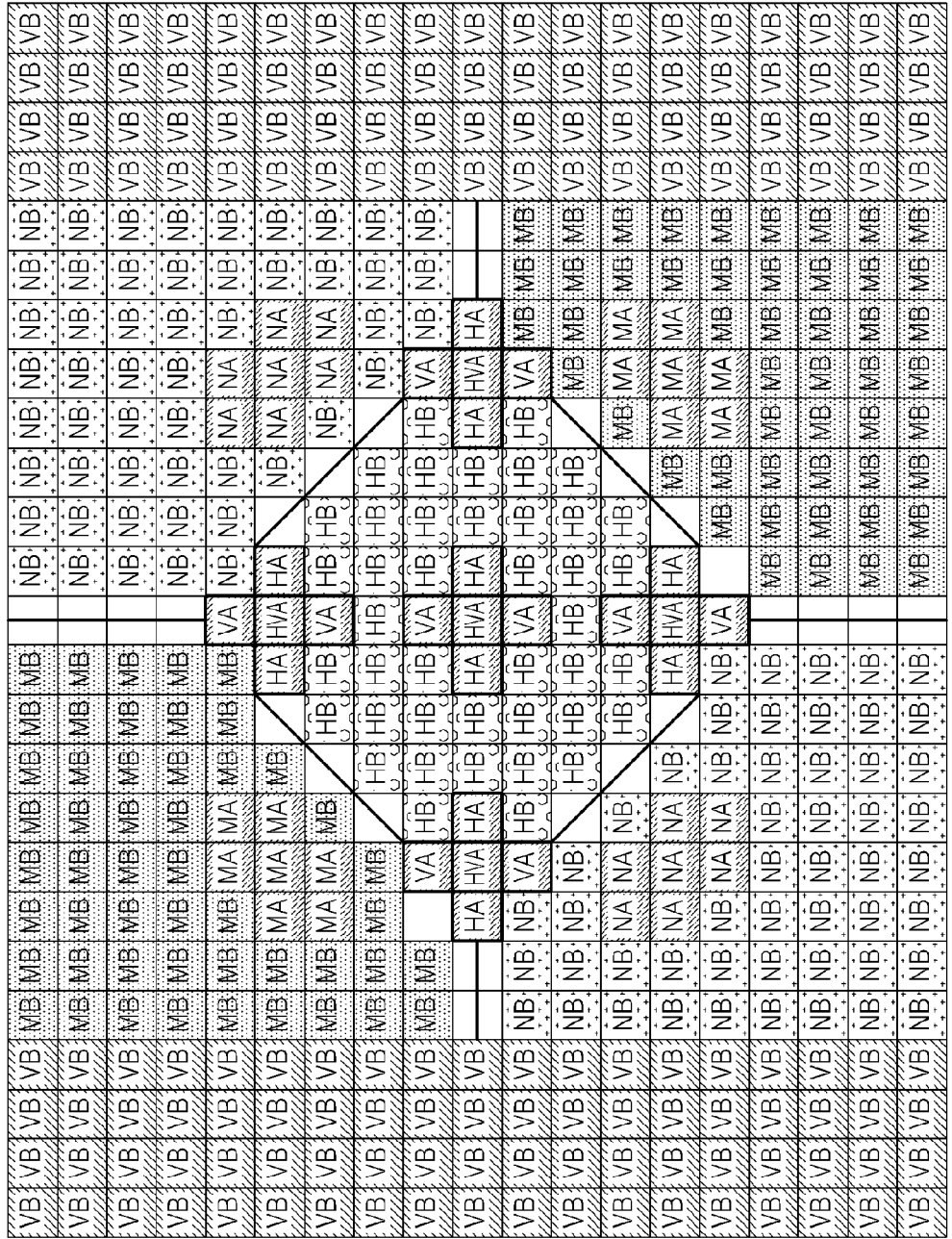
FIG. 34 illustrates a combined configuration of the phase difference pixels of FIGS. 30A, 30B, 31A, 31B, 32A, 32B, 33A, and 33B, according to an embodiment.

FIG. 34 illustrates a combined configuration of the phase difference pixels of FIGS. 30A, 30B, 31A, 31B, 32A, 32B, 33A, and 33B, according to an embodiment.

The configuration of FIG. 34 is for multifocal point detection at nine areas. Referring to FIG. 34, HAs, VAs, and HVAs are arranged at a central area and further arranged on upper, lower, left, and right sides of the central area, and MAs and NAs for focal position detection are arranged in an inclined direction at four areas on left, right, upper, and lower directions of the central area. A detection direction of phase difference information is set in a concentric circle direction with respect to an optical axis of an imaging lens. HBs used to detect a focal direction in a horizontal direction are arranged around the central area, and MBs and NBs are arranged in an inclined direction on upper and lower sides of left and right slopes. In addition, VBs used to detect a focal direction in a vertical direction are arranged on outermost sides of the imaging device.

As described above, according to the one or more embodiments, an imaging device may perform phase difference detection using the entire surface of a captured image without addition of pixels.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The terminology used herein is for the purpose of describing the particular embodiments and is not intended to be limiting of exemplary embodiments of the invention. In the description of the embodiments, certain detailed explanations of related art are omitted when it is deemed that they may unnecessarily obscure the essence of the invention.

The apparatus described herein may comprise a processor, a memory for storing program data to be executed by the processor, a permanent storage such as a disk drive, a communications port for handling communications with external devices, and user interface devices, including a display, touch panel, keys, buttons, etc. When software modules are involved, these software modules may be stored as program instructions or computer readable code executable by the processor on a non-transitory computer-readable media such as magnetic storage media (e.g., magnetic tapes, hard disks, floppy disks), optical recording media (e.g., CD-ROMs, Digital Versatile Discs (DVDs), etc.), and solid state memory (e.g., random-access memory (RAM), read-only memory (ROM), static random-access memory (SRAM), electrically erasable programmable read-only memory (EEPROM), flash memory, thumb drives, etc.). The computer readable recording media may also be distributed over network coupled computer systems so that the computer readable code is stored and executed in a distributed fashion. This computer readable recording media may be read by the computer, stored in the memory, and executed by the processor.

Also, using the disclosure herein, programmers of ordinary skill in the art to which the invention pertains may easily implement functional programs, codes, and code segments for making and using the invention.

The invention may be described in terms of functional block components and various processing steps. Such functional blocks may be realized by any number of hardware and/or software components configured to perform the specified functions. For example, the invention may employ various integrated circuit components, e.g., memory elements, processing elements, logic elements, look-up tables, and the like, which may carry out a variety of functions under the control of one or more microprocessors or other control devices. Similarly, where the elements of the invention are implemented using software programming or software elements, the invention may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the invention may employ any number of conventional techniques for electronics configuration, signal processing and/or control, data processing and the like. Finally, the steps of all methods described herein may be performed in any suitable order unless otherwise indicated herein or otherwise clearly contradicted by context.

For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. The words "mechanism", "element", "means", and "construction" are used broadly and are not limited to mechanical or physical embodiments, but may include software routines in conjunction with processors, etc.

The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those of ordinary skill in this art without departing from the spirit and scope of the invention as defined by the following claims. Therefore, the scope of the invention is defined not by the detailed description of the invention but by the following claims, and all differences within the scope will be construed as being included in the invention.

No item or component is essential to the practice of the invention unless the element is specifically described as "essential" or "critical". It will also be recognized that the terms "comprises," "comprising," "includes," "including," "has," and "having," as used herein, are specifically intended to be read as open-ended terms of art. The use of the terms "a" and "an" and "the" and similar referents in the context of describing the invention (especially in the context of the following claims) are to be construed to cover both the singular and the plural, unless the context clearly indicates otherwise. In addition, it should be understood that although the terms "first," "second," etc. may be used herein to describe various elements, these elements should not be limited by these terms, which are only used to distinguish one element from another. Furthermore, recitation of ranges of values herein are merely intended to serve as a shorthand method of referring individually to each separate value falling within the range, unless otherwise indicated herein, and each separate value is incorporated into the specification as if it were individually recited herein.

What is claimed is:

1. An imaging device comprising:
    an imaging lens having an optical axis; and
    a plurality of pixels arranged in a two-dimensional array having rows of pixels aligned in vertical and horizontal directions;
    wherein each pixel comprises:
        a micro lens having an optical axis; and
        a photodiode behind the micro lens;
    wherein the plurality of pixels comprise phase difference pixels, and each phase difference pixel further comprises an aperture mask defining a light restricting portion that prevents light from the micro lens reaching the photodiode and a single light passing portion that admits light from the micro lens to the photodiode;
    wherein the light passing portion of the aperture mask of each phase difference pixel has a center which is offset in an offset direction from the optical axis of the micro lens;
    wherein the phase difference pixels comprise outer phase difference pixels spaced from the optical axis of the imaging lens, the offset direction of the light passing portion of the aperture mask of each outer phase difference pixel is in a direction along a circumference of a circle centered on the imaging lens optical axis and in a direction that is not orthogonal to the vertical and horizontal directions of the array;
    wherein the outer phase difference pixels are divided into a plurality of outer regions, wherein the offset direction of the light passing portion of the aperture mask of each outer phase difference pixel in one outer region of the plurality of outer regions is the same for each outer phase difference pixel in the one outer region, the offset direction of the light passing portion of the aperture mask of each outer phase difference pixel in each outer region of the plurality of outer regions is different, and the offset directions comprise two conversely slanting offset directions and one vertical or horizontal offset direction; and
    wherein the plurality of outer regions comprise a top left region, a bottom right region, a top right region, a bottom left region, and two side regions, wherein the offset direction in the top left region and the bottom right region slant top right to bottom left and the offset direction in the top right region and bottom left region slant top left to bottom right, and wherein the offset direction in the two side regions is vertical.

2. An imaging device configured to receive an image formed by an optical system, the imaging device comprising pixels that are two-dimensionally arranged, each of pixels comprising:
- a micro lens;
- a photoelectric conversion unit positioned below the micro lens; and
- an optical aperture disposed between the micro lens and the photoelectric conversion unit and that is eccentric with respect to an optical axis of the micro lens,
- wherein a plurality of pixels of the imaging device output signals for obtaining focal information and comprise first pixels, second pixels, and third pixels,
- each of the first pixels has a first aperture ratio, a first optical aperture corresponding to the first aperture ratio does not include the optical axis, and
- each of the second pixels has a second aperture ratio that is greater than the first aperture ratio, a second optical aperture corresponding to the second aperture ratio include the optical axis, and
- each of the third pixels has a third aperture ratio that is smaller than the first aperture ratio.

* * * * *